(12) United States Patent
Fan

(10) Patent No.: US 11,159,172 B2
(45) Date of Patent: Oct. 26, 2021

(54) CAPACITIVE ANALOG-TO-DIGITAL CONVERTER, ANALOG-TO-DIGITAL CONVERSION SYSTEM, CHIP, AND DEVICE

(71) Applicant: Shenzhen Goodix Technology Co., Ltd., Shenzhen (CN)

(72) Inventor: Shuo Fan, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/019,749

(22) Filed: Sep. 14, 2020

(65) Prior Publication Data
US 2020/0412375 A1 Dec. 31, 2020

Related U.S. Application Data

(63) Continuation of application No. PCT/CN2019/081292, filed on Apr. 3, 2019.

(51) Int. Cl.
*H03M 1/44* (2006.01)
*H03M 1/80* (2006.01)
*H03M 1/46* (2006.01)

(52) U.S. Cl.
CPC .......... *H03M 1/442* (2013.01); *H03M 1/468* (2013.01); *H03M 1/804* (2013.01)

(58) Field of Classification Search
CPC ....... H03M 1/442; H03M 1/804; H03M 1/468
USPC .................................................. 341/163, 172
See application file for complete search history.

(56) References Cited

U.S. PATENT DOCUMENTS

| | | | |
|---|---|---|---|
| 9,432,046 B1* | 8/2016 | Yu | H03M 1/468 |
| 9,553,599 B1* | 1/2017 | Chen | H03M 1/1033 |
| 10,097,198 B1* | 10/2018 | Lee | H03M 1/466 |
| 2006/0232461 A1 | 10/2006 | Felder | |

FOREIGN PATENT DOCUMENTS

| CN | 104113341 A | 10/2014 |
|---|---|---|
| CN | 204376879 U | 6/2015 |

OTHER PUBLICATIONS

International Search Report dated Jan. 6, 2020 in corresponding International application No. PCT/CN2019/081292; 4 pages.
(Continued)

*Primary Examiner* — Khai M Nguyen
(74) *Attorney, Agent, or Firm* — Maier & Maier, PLLC

(57) ABSTRACT

A capacitive analog-to-digital converter, an analog-to-digital conversion system, a chip, and a device. The capacitive analog-to-digital converter includes: a first capacitor array, including N first capacitor banks that include M first capacitors, where M is a positive integer greater than N; M first switches, respectively connected to first electrode plates of the M first capacitors in a one-to-one correspondence to enable a successive approximation logic controller to control connections of the first electrode plates of the M first capacitors with an output of a voltage generation circuit and with a first sampling voltage output by controlling the M first switches; a comparator, including a first input, a second input and an output; and the successive approximation logic controller, connected to the output of the comparator, and configured to control the M first switches according to comparison results output by the output of the comparator.

19 Claims, 4 Drawing Sheets

(56) References Cited

OTHER PUBLICATIONS

Extended European Search Report dated Sep. 2, 2021, including the Supplementary European Search Report and the European Search Opinion, in connection with corresponding EP Application No. 19917555.5 (8pp.).

Brian P. Ginsburg, et al., "An Energy-Efficient Charge Recycling Approach for a SAR Converter With Capacitive DAC", IEEE International Symposium on Circuits and Systems (ISCAS), International Conference Center, Kobe, Japan, IEEE Service Center, Piscataway, NJ, XP010815508, May 23, 205, pp. 184-187 (4pp.).

Wen-Yi Pang, et al., "A 10-bit 500-KS/s Low Power SAR ASC withh Splitting Computer for Bio-Medical Applications", IEEE Asian Solid-State Circuits Conference (A-SSCC), IEEE Asian, IEEE, Piscataway, NJ, USA, Nov. 16, 2009, pp. 149-152 (4pp.).

* cited by examiner

CAPACITIVE ANALOG-TO-DIGITAL CONVERTER, ANALOG-TO-DIGITAL CONVERSION SYSTEM, CHIP, AND DEVICE

CROSS-REFERENCE TO RELATED APPLICATIONS

This application is a continuation application of the International application PCT/CN2019/081292, filed on Apr. 3, 2019, entitled "CAPACITIVE ANALOG-TO-DIGITAL CONVERTER, ANALOG-TO-DIGITAL CONVERSION SYSTEM, CHIP, AND DEVICE", the content of which is hereby incorporated by reference in its entirety.

FIELD

The present application relates to the field of electronic technologies and, in particular, to a capacitive analog-to-digital converter, an analog-to-digital conversion system, a chip, and a device.

BACKGROUND

An analog-to-digital converter is widely used in image processing, digital video, biomedicine and other fields. While for a handheld mobile terminal device (such as an image sensor) with increasingly wide applications, low power consumption plays a vital role in service life of product batteries. At the same time, with people's higher requirements on image quality and other sensory experience as well as pursuit on more detailed data information, an analog-to-digital converter system is required to have a faster conversion speed and higher resolution accuracy.

SUMMARY

The present application provides a capacitive analog-to-digital converter, an analog-to-digital conversion system, a chip, and a device. Not only analog-to-digital conversion is achieved, but also accuracy of the analog-to-digital conversion is improved.

In a first aspect, the present application provides a capacitive analog-to-digital converter, including:

a first capacitor array, including N first capacitor banks that include M first capacitors, where N is the number of bits of binary codes output by the capacitive analog-to-digital converter, N is a positive integer greater than or equal to 3, and M is a positive integer greater than N; M first switches, respectively connected to first electrode plates of the M first capacitors in a one-to-one correspondence to enable a successive approximation logic controller to control connections of the first electrode plates of the M first capacitors with an output of a voltage generation circuit and with a first sampling voltage output by controlling the M first switches; a comparator, including a first input, a second input and an output, where second electrode plates of the M first capacitors are connected to the first input, and a first output of the voltage generation circuit is connected to the second input, and where the comparator is configured to: compare a magnitude of voltage received at the first input with a magnitude of voltage received at the second input, and output N comparison results respectively corresponding to N bits of binary codes via the output of the comparator; and the successive approximation logic controller, connected to the output of the comparator, and configured to control the M first switches according to the comparison results output by the output of the comparator.

In this solution, a first capacitor array includes N capacitor banks connected to an input of a comparator, another terminal of the comparator is connected to a voltage generation circuit, an output of the comparator is connected to a successive approximation logic controller, and the successive approximation logic controller is configured to control, according to output results from the output of the comparator, a switch connected to each capacitor in such a manner that analog-to-digital conversion is achieved. Since the N first capacitor banks include M first capacitors and M is a positive integer greater than N, accuracy of the analog-to-digital conversion is improved by means of dividing high-level capacitors into capacitor banks and separately controlling capacitors in the capacitor banks.

In an implementation, the capacitive analog-to-digital converter provided in the present application further includes:

a second switch, having its one end connected to the first input of the comparator and its other end connected to the first output of the voltage generation circuit.

In this solution, the second switch is provided to achieve disconnection and connection between the first input of the comparator and the first output of the voltage generation circuit.

In an implementation, the successive approximation logic controller is configured to: in a sampling stage, control the M first switches in such a manner that the first electrode plates of the M first capacitors are connected to the first sampling voltage output, and control the second switch in such a manner that the first input of the comparator is connected to the first output of the voltage generation circuit.

In this solution, the M first switches are controlled in such a manner that the electrode plates of the M first capacitors are connected to the first sampling voltage output, thereby achieving acquisition of a first sampling voltage analog signal, and the first input of the comparator is connected to the first output of the voltage generation circuit, thereby achieving control over the amount of charge acquired.

In an implementation, the successive approximation logic controller is configured to: in a conversion stage, control the M first switches and the second switch to enable the M first capacitors to operate in an $n^{th}$ comparison mode, where $n=1, \ldots, N$; the comparator is configured to: compare the magnitude of voltage received at the first input of the comparator with the magnitude of voltage received at the second input of the comparator under a circumstance that the M first capacitors are operating in the $n^{th}$ comparison mode, determine an $n^{th}$ comparison result among the N comparison results, and output the $n^{th}$ comparison result to the successive approximation logic controller, where the $n^{th}$ comparison result corresponds to an $N-n+1^{th}$ bit binary code among the N bits of binary codes.

In this solution, the M first switches and the second switch are controlled by the successive approximation logic controller, so that conversion of a sampling voltage analog signal into a digital signal is achieved.

In an implementation, the successive approximation logic controller is configured to: in the conversion stage, control the second switch to disconnect a connection of the first input of the comparator with the first output of the voltage generation circuit; and control the M first switches in such a manner that a first capacitor in a first capacitor bank including a plurality of first capacitors is connected to a second reference voltage or connected to ground and in such a manner that a first capacitor in a first capacitor bank including one first capacitor is connected to a third reference voltage or connected to a fourth reference voltage, to enable the M first capacitors to operate in the $n^{th}$ comparison mode.

In an implementation, for each first capacitor bank including a plurality of first capacitors, the successive approximation logic controller is configured to control first switches corresponding to the plurality of first capacitors in the first capacitor bank in such a manner that first electrode plates of a first portion of first capacitors among the plurality of first capacitors are connected to a second output of the voltage generation circuit and first electrode plates of a second portion of first capacitors are connected to ground, to enable the M first capacitors to operate in a $1^{st}$ comparison mode;

according to a $1^{st}$ comparison result output by the comparator, for each first capacitor bank including a plurality of first capacitors, the successive approximation logic controller is configured to control a first switch for a first capacitor in the first capacitor bank in such a manner that a first electrode plate of any first capacitor whose first electrode plate is connected to the second output of the voltage generation circuit is connected to ground or in such a manner that a first electrode plate of any first capacitor whose first electrode plate is connected to ground is connected to the second output of the voltage generation circuit, to enable the M first capacitors to operate in a $2^{nd}$ comparison mode;

according to an $m^{th}$ comparison result output by the comparator, the successive approximation logic controller is configured to control a first switch for any first capacitor in an $N-m+2^{th}$ first capacitor bank whose first electrode plate is connected to ground in such a manner that the first electrode plate of the first capacitor is connected to the second output of the voltage generation circuit; or, the successive approximation logic controller is configured to control a first switch for any first capacitor in the $N-m+2^{th}$ first capacitor bank whose first electrode plate is connected to the second output of the voltage generation circuit in such a manner that the first electrode plate of the first capacitor is connected to ground, to enable the M first capacitors to operate in an $m+1^{th}$ comparison mode, where m=2, ..., N−2; according to an $N-1^{th}$ comparison result output by the comparator, the successive approximation logic controller is configured to control a first switch for a first capacitor in a $3^{rd}$ first capacitor bank in such a manner that a first electrode plate of the first capacitor is connected to a third output of the voltage generation circuit or a fourth output of the voltage generation circuit;

according to an $N^{th}$ comparison result output by the comparator, the successive approximation logic controller is configured to control a first switch for a first capacitor in a $2^{nd}$ first capacitor bank in such a manner that a first electrode plate of the first capacitor is connected to the third output of the voltage generation circuit or the fourth output of the voltage generation circuit;

where the second output of the voltage generation circuit outputs the second reference voltage, the third output of the voltage generation circuit outputs the third reference voltage, and the fourth output of the voltage generation circuit outputs the fourth reference voltage.

In this solution, states of the M first switches are controlled in different comparison modes, so that conversion of a sampling voltage analog signal into a digital signal is achieved, and accuracy of the analog-to-digital conversion is improved.

In an implementation, the first portion of first capacitors and the second portion of first capacitors are equal in number, and the first portion of first capacitors and the second portion of first capacitors form the first capacitor bank.

In an implementation, the capacitive analog-to-digital converter provided in the present application includes:

a $1^{st}$ one of the N first capacitor banks has a capacitance of C, and a $k^{th}$ one of the N first capacitor banks has a capacitance of $2^{k-2}C$, where C is capacitance per unit;

a $p^{th}$ one of the N first capacitor banks includes one first capacitor, where p is an integer less than or equal to 3, and a $q^{th}$ one of the N first capacitor banks includes a plurality of first capacitors, where q is an integer greater than 3.

In an implementation, the comparator is specifically configured to: output a comparison result of 1 under a circumstance that the magnitude of voltage received at the first input of the comparator is greater than or equal to the magnitude of voltage received at the second input of the comparator; and output a comparison result of 0 under a circumstance that the magnitude of voltage received at the first input of the comparator is less than the magnitude of voltage received at the second input of the comparator.

In an implementation, if a first capacitor bank has a capacitance which is an integer multiple of 4C, the first capacitor bank includes four capacitors with equal capacitance.

The following is an introduction to a capacitive analog-to-digital converter, for effects thereof, reference may be made to the capacitive analog-to-digital converter provided in the first aspect.

In a second aspect, the present application provides a capacitive analog-to-digital converter, including:

a first capacitor array, including N first capacitor banks that include M first capacitors, where N is the number of bits of binary codes output by the capacitive analog-to-digital converter, N is a positive integer greater than or equal to 3, and M is a positive integer greater than N; a second capacitor array, including N second capacitor banks that include M second capacitors; M first switches, respectively connected to first electrode plates of the M first capacitors in a one-to-one correspondence to enable a successive approximation logic controller to control connections of the first electrode plates of the M first capacitors with an output of a voltage generation circuit and with a first sampling voltage output by controlling the M first switches; M third switches, respectively connected to first electrode plates of the M second capacitors in a one-to-one correspondence to enable the successive approximation logic controller to control connections of the first electrode plates of the M second capacitors with the output of the voltage generation circuit and with a second sampling voltage output by controlling the M third switches; a comparator, including a first input, a second input and an output, where second electrode plates of the M first capacitors are connected to the first input, and second electrode plates of the M second capacitors are connected to the second input, and where the comparator is configured to: compare a magnitude of voltage received at the first input with a magnitude of voltage received at the second input, and output N comparison results respectively corresponding to N bits of binary codes via the output of the comparator; and the successive approximation logic controller, connected to the output of the comparator, and configured to control the M first switches and the M third switches according to the comparison results output by the output of the comparator.

In this solution, the first capacitor array and the second capacitor array are provided, so that conversion of a differential signal into a digital signal is achieved, and accuracy of the conversion of the differential signal into the digital signal is improved.

In an implementation, the capacitive analog-to-digital converter provided in the present application further includes:

a second switch, having its one end connected to the first input of the comparator and its other end connected to the first output of the voltage generation circuit, where the first output of the voltage generation circuit outputs a first reference voltage; and a fourth switch, having its one end connected to the second input of the comparator and its other end connected to the first output of the voltage generation circuit, where the first output of the voltage generation circuit outputs a first reference voltage.

In an implementation, the successive approximation logic controller is configured to: in a sampling stage, control the M first switches in such a manner that the first electrode plates of the M first capacitors are connected to the first sampling voltage output, and control the second switch in such a manner that the first input of the comparator is connected to the first output of the voltage generation circuit; and control the M third switches in such a manner that the first electrode plates of the M second capacitors are connected to the second sampling voltage output, and control the fourth switch in such a manner that the second input of the comparator is connected to the first output of the voltage generation circuit.

In an implementation, the successive approximation logic controller is configured to: in a conversion stage, control the M first switches, the second switch, the M third switches and the fourth switch to enable the M first capacitors and the M second capacitors to operate in an $n^{th}$ comparison mode, where n=1, . . . , N; the comparator is configured to: compare the magnitude of voltage received at the first input of the comparator with the magnitude of voltage received at the second input of the comparator under a circumstance that the M first capacitors and the M second capacitors are operating in the $n^{th}$ comparison mode, determine an $n^{th}$ comparison result among the N comparison results, and output the $n^{th}$ comparison result to the successive approximation logic controller, where the $n^{th}$ comparison result corresponds to an $N-n+1^{th}$ bit binary code among the N bits of binary codes.

In an implementation, the successive approximation logic controller is configured to: in the conversion stage, control the second switch to disconnect a connection of the first input of the comparator with the first output of the voltage generation circuit, and control the fourth switch to disconnect a connection of the second input of the comparator with the first output of the voltage generation circuit; and control the M first switches in such a manner that a first capacitor in a first capacitor bank including a plurality of first capacitors is connected to a second reference voltage or connected to ground and in such a manner that a first capacitor in a first capacitor bank including one first capacitor is connected to a third reference voltage or connected to a fourth reference voltage, and control the M third switches in such a manner that a second capacitor in a second capacitor bank including a plurality of second capacitors is connected to the second reference voltage or connected to ground and in such a manner that a second capacitor in a second capacitor bank including one second capacitor is connected to the third reference voltage or connected to the fourth reference voltage, to enable the M first capacitors and the M second capacitors to operate in the $n^{th}$ comparison mode.

In an implementation, for each first capacitor bank including a plurality of first capacitors, the successive approximation logic controller is configured to control first switches corresponding to the plurality of first capacitors in the first capacitor bank in such a manner that first electrode plates of a first portion of first capacitors among the plurality of first capacitors are connected to a second output of the voltage generation circuit and first electrode plates of a second portion of first capacitors are connected to ground, for each second capacitor bank including a plurality of second capacitors, the successive approximation logic controller is configured to control third switches corresponding to the plurality of second capacitors in the second capacitor bank in such a manner that first electrode plates of a first portion of second capacitors among the plurality of second capacitors are connected to a second output of the voltage generation circuit and first electrode plates of a second portion of second capacitors are connected to ground, to enable the M first capacitors and the M second capacitors to operate in a $1^{st}$ comparison mode;

according to a $1^{th}$ comparison result output by the comparator, for each first capacitor bank including a plurality of first capacitors, the successive approximation logic controller is configured to control a first switch for a first capacitor in the first capacitor bank in such a manner that a first electrode plate of any first capacitor whose first electrode plate is connected to the second output of the voltage generation circuit is connected to ground, for each second capacitor bank including a plurality of second capacitors, the successive approximation logic controller is configured to control a third switch for a second capacitor in the second capacitor bank in such a manner that a first electrode plate of any second capacitor whose first electrode plate is connected to ground is connected to the second output of the voltage generation circuit, or, according to a $1^{st}$ comparison result output by the comparator, for each first capacitor bank including a plurality of first capacitors, the successive approximation logic controller is configured to control a first switch for a first capacitor in the first capacitor bank in such a manner that a first electrode plate of any first capacitor whose first electrode plate is connected to ground is connected to the second output of the voltage generation circuit, for each second capacitor bank including a plurality of second capacitors, the successive approximation logic controller is configured to control a third switch for a second capacitor in the second capacitor bank in such a manner that a first electrode plate of any second capacitor whose first electrode plate is connected to the second output of the voltage generation circuit is connected to ground, to enable the M first capacitors and the M second capacitors to operate in a $2^{nd}$ comparison mode;

according to an $m^{th}$ comparison result output by the comparator, the successive approximation logic controller is configured to control a first switch for any first capacitor in an $N-m+2^{th}$ first capacitor bank whose first electrode plate is connected to ground in such a manner that the first electrode plate of the first capacitor is connected to the second output of the voltage generation circuit, and control a third switch for any second capacitor in an $N-m+2^{th}$ second capacitor bank whose first electrode plate is connected to the second output of the voltage generation circuit in such a manner that the first electrode plate of the second capacitor is connected to ground; or, according to an $m^{th}$ comparison result output by the comparator, the successive approximation logic controller is configured to control a first switch for any first capacitor in the $N-m+2^{th}$ first capacitor bank whose first electrode plate is connected to the second output of the voltage generation circuit in such a manner that the first electrode plate of the first capacitor is connected to ground, and control a third switch for any second capacitor in the N−m+2$^{th}$ second capacitor bank whose first electrode plate is connected to ground in such a manner that the first electrode plate of the second capacitor is connected to the second output of the voltage generation circuit, to enable the M first capacitors and the M second capacitors to operate in an m+1$^{th}$ comparison mode, where m=2, . . . , N−2;

according to an N−1$^{th}$ comparison result output by the comparator, the successive approximation logic controller is configured to control a first switch for a first capacitor in a 3$^{rd}$ first capacitor bank in such a manner that a first electrode plate of the first capacitor is connected to a third output of the voltage generation circuit, and control a third switch for a second capacitor in a 3$^{rd}$ second capacitor bank in such a manner that a first electrode plate of the second capacitor is connected to a fourth output of the voltage generation circuit; or, according to an N−1$^{th}$ comparison result output by the comparator, the successive approximation logic controller is configured to control the first switch for the first capacitor in the 3$^{rd}$ first capacitor bank in such a manner that the first electrode plate of the first capacitor is connected to the fourth output of the voltage generation circuit, and control the third switch for the second capacitor in the 3$^{rd}$ second capacitor bank in such a manner that the first electrode plate of the second capacitor is connected to the third output of the voltage generation circuit;

according to an N$^{th}$ comparison result output by the comparator, the successive approximation logic controller is configured to control a first switch for a first capacitor in a 2$^{nd}$ first capacitor bank in such a manner that a first electrode plate of the first capacitor is connected to the third output of the voltage generation circuit, and control a third switch for a second capacitor in a 2$^{nd}$ second capacitor bank in such a manner that a first electrode plate of the second capacitor is connected to the fourth output of the voltage generation circuit; or, according to an N$^{th}$ comparison result output by the comparator, the successive approximation logic controller is configured to control the first switch for the first capacitor in the 2$^{nd}$ first capacitor bank in such a manner that the first electrode plate of the first capacitor is connected to the fourth output of the voltage generation circuit, and control the third switch for the second capacitor in the 2$^{nd}$ second capacitor bank in such a manner that the first electrode plate of the second capacitor is connected to the third output of the voltage generation circuit;

where the second output of the voltage generation circuit outputs the second reference voltage, the third output of the voltage generation circuit outputs the third reference voltage, and the fourth output of the voltage generation circuit outputs the fourth reference voltage.

In an implementation, the first portion of first capacitors and the second portion of first capacitors are equal in number, and the first portion of first capacitors and the second portion of first capacitors form the first capacitor bank; and the first portion of second capacitors and the second portion of second capacitors are equal in number, and the first portion of second capacitors and the second portion of second capacitors form the second capacitor bank.

In an implementation, a 1$^{st}$ one of the N first capacitor banks has a capacitance of C, and a k$^{th}$ one of the N first capacitor banks has a capacitance of $2^{k-2}$C, where C is capacitance per unit; a p$^{th}$ one of the N first capacitor banks includes one first capacitor, where p is an integer less than or equal to 3, and a q$^{th}$ one of the N first capacitor banks includes a plurality of first capacitors, where q is an integer greater than 3; a 1$^{th}$ one of the N second capacitor banks has a capacitance of C, and a k$^{th}$ one of the N second capacitor banks has a capacitance of $2^{k-2}$C; and a p$^{th}$ one of the N second capacitor banks includes one second capacitor, and a q$^{th}$ one of the N second capacitor banks includes a plurality of second capacitors.

In an implementation, the comparator is specifically configured to: output a comparison result of 1 under a circumstance that the magnitude of voltage received at the first input of the comparator is greater than or equal to the magnitude of voltage received at the second input of the comparator; and output a comparison result of 0 under a circumstance that the magnitude of voltage received at the first input of the comparator is less than the magnitude of voltage received at the second input of the comparator.

In an implementation, if a first capacitor bank has a capacitance which is an integer multiple of 4C, the first capacitor bank includes four capacitors with equal capacitance; and if a second capacitor bank has a capacitance which is an integer multiple of 4C, the second capacitor bank includes four capacitors with equal capacitance.

In a third aspect, the present application provides an analog-to-digital conversion system, including:

a voltage generation circuit, a first sampling voltage generation module, and the capacitive analog-to-digital converter according to the first aspect described above and an optional implementation of the first aspect;

where the voltage generation circuit includes a voltage generation circuit output which is configured to output a voltage;

the first sampling voltage generation module includes a first sampling voltage output which is configured to output a first sampling voltage;

the capacitive analog-to-digital converter includes:

a first capacitor array, including N first capacitor banks that include M first capacitors, where N is the number of bits of binary codes output by the capacitive analog-to-digital converter, N is a positive integer greater than or equal to 3, and M is a positive integer greater than N;

M first switches, respectively connected to first electrode plates of the M first capacitors in a one-to-one correspondence to enable a successive approximation logic controller to control connections of the first electrode plates of the M first capacitors with the output of the voltage generation circuit and with the first sampling voltage output by controlling the M first switches;

a comparator, including a first input, a second input and an output, where second electrode plates of the M first capacitors are connected to the first input, and a first output of the voltage generation circuit is connected to the second input, and where the comparator is configured to: compare a magnitude of voltage received at the first input with a magnitude of voltage received at the second input, and output N comparison results respectively corresponding to N bits of binary codes via the output of the comparator; and the successive approximation logic controller, connected to the output of the comparator, and configured to control the M first switches according to the comparison results output by the output of the comparator.

In a fourth aspect, the present application provides an analog-to-digital conversion system, including:

a voltage generation circuit, a first sampling voltage generation module, a second sampling voltage generation module, and the capacitive analog-to-digital converter according to the second aspect described above and an optional implementation of the second aspect;

where the voltage generation circuit includes a voltage generation circuit output which is configured to output a voltage;

the first sampling voltage generation module includes a first sampling voltage output which is configured to output a first sampling voltage;

the second sampling voltage generation module includes a second sampling voltage output which is configured to output a second sampling voltage;

the capacitive analog-to-digital converter includes:

a first capacitor array, including N first capacitor banks that include M first capacitors, where N is the number of bits of binary codes output by the capacitive analog-to-digital converter, N is a positive integer greater than or equal to 3, and M is a positive integer greater than N;

a second capacitor array, including N second capacitor banks that include M second capacitors;

M first switches, respectively connected to first electrode plates of the M first capacitors in a one-to-one correspondence to enable a successive approximation logic controller to control connections of the first electrode plates of the M first capacitors with the output of the voltage generation circuit and with the first sampling voltage output by controlling the M first switches;

M third switches, respectively connected to first electrode plates of the M second capacitors in a one-to-one correspondence to enable a successive approximation logic controller to control connections of the first electrode plates of the M second capacitors with the output of the voltage generation circuit and with the second sampling voltage output by controlling the M third switches;

a comparator, including a first input, a second input and an output, where second electrode plates of the M first capacitors are connected to the first input, second electrode plates of the M second capacitors are connected to the second input, and where the comparator is configured to: compare a magnitude of voltage received at the first input with a magnitude of voltage received at the second input, and output N comparison results respectively corresponding to N bits of binary codes via the output of the comparator; and the successive approximation logic controller, connected to the output of the comparator, and configured to control the M first switches and the M third switches according to the comparison results output by the output of the comparator.

In a fifth aspect, the present application provides a chip, including the capacitive analog-to-digital converter according to the first aspect or an optional implementation of the first aspect.

In a sixth aspect, the present application provides a terminal, including the capacitive analog-to-digital converter according to the first aspect or an optional implementation of the first aspect.

In a seventh aspect, the present application provides a chip, including the capacitive analog-to-digital converter according to the second aspect or an optional implementation of the second aspect.

In an eighth aspect, the present application provides a device, including the capacitive analog-to-digital converter according to the second aspect or an optional implementation of the second aspect.

The present application provides a capacitive analog-to-digital converter, an analog-to-digital conversion system, a chip, and a device. The capacitive analog-to-digital converter includes: a first capacitor array, including N first capacitor banks that include M first capacitors, where N is the number of bits of binary codes output by the capacitive analog-to-digital converter, N is a positive integer greater than or equal to 3, and M is a positive integer greater than N; M first switches, respectively connected to first electrode plates of the M first capacitors in a one-to-one correspondence to enable a successive approximation logic controller to control connections of the first electrode plates of the M first capacitors with an output of a voltage generation circuit and with a first sampling voltage output by controlling the M first switches; a comparator, including a first input, a second input and an output, where second electrode plates of the M first capacitors are connected to the first input, and a first output of the voltage generation circuit is connected to the second input, and where the comparator is configured to: compare a magnitude of voltage received at the first input with a magnitude of voltage received at the second input, and output N comparison results respectively corresponding to N bits of binary codes via the output of the comparator; and the successive approximation logic controller, connected to the output of the comparator, and configured to control the M first switches according to the comparison results output by the output of the comparator. Since a first capacitor array includes N capacitor banks connected to an input of a comparator, another terminal of the comparator is connected to a voltage generation circuit, an output of the comparator is connected to a successive approximation logic controller, and the successive approximation logic controller is configured to control, according to output results from the output of the comparator, a switch connected to each capacitor in such a manner that analog-to-digital conversion is achieved. Since the N first capacitor banks include M first capacitors and M is a positive integer greater than N, accuracy of the analog-to-digital conversion is improved by means of dividing high-level capacitors into capacitor banks and separately controlling capacitors in the capacitor banks.

BRIEF DESCRIPTION OF DRAWINGS

In order to describe technical solutions in embodiments of the present application or in the related art more clearly, accompanying drawings used for description of the embodiments or the related art will be briefly described hereunder. Obviously, the described drawings are some embodiments of present application. For persons of ordinary skill in the art, other drawings may be obtained based on these drawings without any creative effort.

DESCRIPTION OF REFERENCE NUMERALS

11: capacitor array;
12, 23, 33, 63: comparator;

13, 24, 34, 64: successive approximation logic controller;
14: switch;
21: positive capacitor array;
22: negative capacitor array;
30, 70: capacitive analog-to-digital converter;
31, 61: first capacitor array;
32, 65: M first switches;
35, 67: second switch;
36, 71: voltage generation circuit;
37, 72: first sampling voltage generation module;
41: first output of the voltage generation circuit;
42: second output of the voltage generation circuit;
43: third output of the voltage generation circuit;
44: fourth output of the voltage generation circuit;
62: second capacitor array;
66: M third switches;
68: fourth switch;
$V_{ip}$: first sampling voltage output;
$V_{in}$: second sampling voltage output; and
73: second sampling voltage generation module.

DESCRIPTION OF EMBODIMENTS

In order to describe objectives, technical solutions, and advantages of embodiments of the present application more clearly, the technical solutions in the embodiments of the present application will be described hereunder clearly and comprehensively with reference to accompanying drawings in the embodiments of the present application. Obviously, the described embodiments are only a part of embodiments of the present application, rather than all embodiments of the present application. All other embodiments obtained by persons of ordinary skill in the art based on the embodiments of the present application without any creative effort should fall into the scope claimed in the present application.

Terms such as "first", "second", "third", "fourth", etc. (if present) in the specification and the claims as well as the described accompany drawings of the present application are used to distinguish similar objects, but not intended to describe a specific order or sequence. It will be appreciated that data used in this way may be interchangeable under appropriate circumstances, in such a manner that the embodiments of the present application described herein can be implemented in an order other than those illustrated or described herein, for instance. Moreover, terms such as "include" and "have" and any variation thereof are intended to cover a non-exclusive inclusion, e.g., processes, methods, systems, products or devices that encompass a series of steps or units are not necessarily limited to those steps or units that are clearly listed, but may include other steps or units that are not explicitly listed or inherent to these processes, methods, products or devices.

Figure 1:
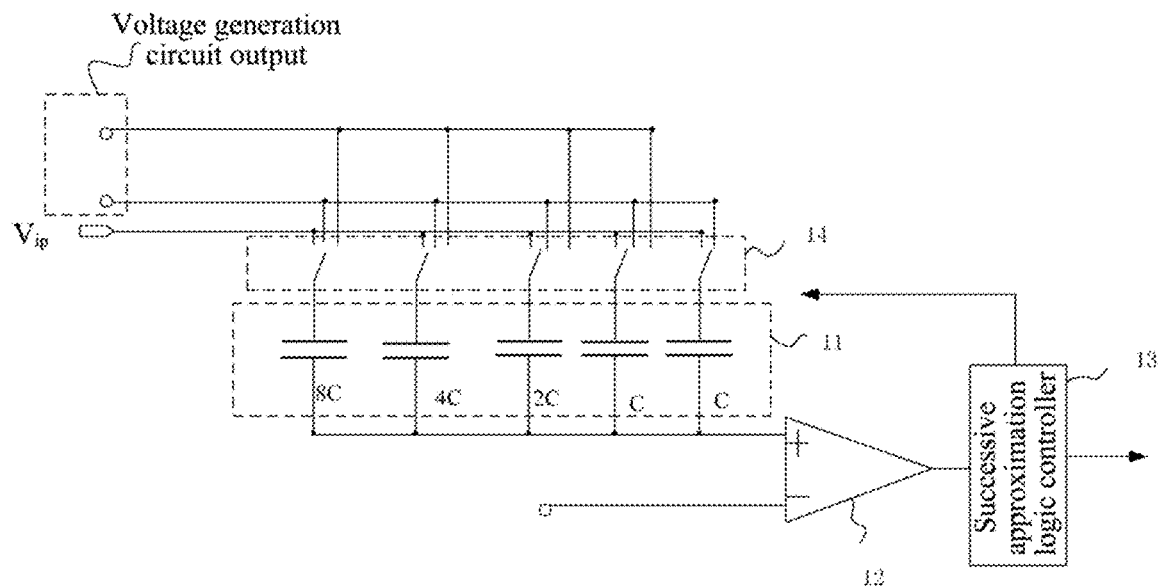
FIG. 1 is a schematic structural diagram of an exemplary capacitive analog-to-digital converter in the related art.

For a capacitive analog-to-digital converter in related art, generally, a plurality of capacitors arranged in a binary manner are used to achieve analog-to-digital conversion. The following takes a 4-bit analog-to-digital converter as an example to introduce the related art. FIG. 1 is a schematic structural diagram of an exemplary capacitive analog-to-digital converter in the related art. As shown in FIG. 1, the 4-bit analog-to-digital converter includes a capacitor array 11, capacitors in which are arranged in a binary manner; an upper electrode plate of a capacitor in the capacitor array 11 is connected to an input of a comparator 12, another input of the comparator 12 is connected to a voltage generation circuit, and an output of the capacitor 12 is connected to a successive approximation logic controller 13 which controls, according to comparison results output by the output of the comparator 12, a connection of a switch 14 with an output of the voltage generation circuit and with a sampling voltage $V_{ip}$ to enable the capacitor array 11 to be in a conversion stage in such a manner that the analog-to-digital conversion is finally achieved.

However, in the related art, through direct control of high-level capacitance, the analog-to-digital conversion has low accuracy.

An analog-to-digital converter is widely used in image processing, digital video, biomedicine and other fields. While for a handheld mobile terminal device (such as an image sensor) with increasingly wide applications, low power consumption plays a vital role in service life of product batteries. At the same time, with people's higher requirements on image quality and other sensory experience as well as pursuit on more detailed data information, an analog-to-digital converter system is required to have a faster conversion speed and higher resolution accuracy. In the related art, the capacitive analog-to-digital converter as shown in FIG. 1 is usually used. However, the capacitive analog-to-digital converter in the related art is less accurate. In order to solve the above problems, the present application provides a capacitive analog-to-digital converter, an analog-to-digital conversion system, a chip, and a device.

The following will introduce an application scenario of the present application.

Figure 2:
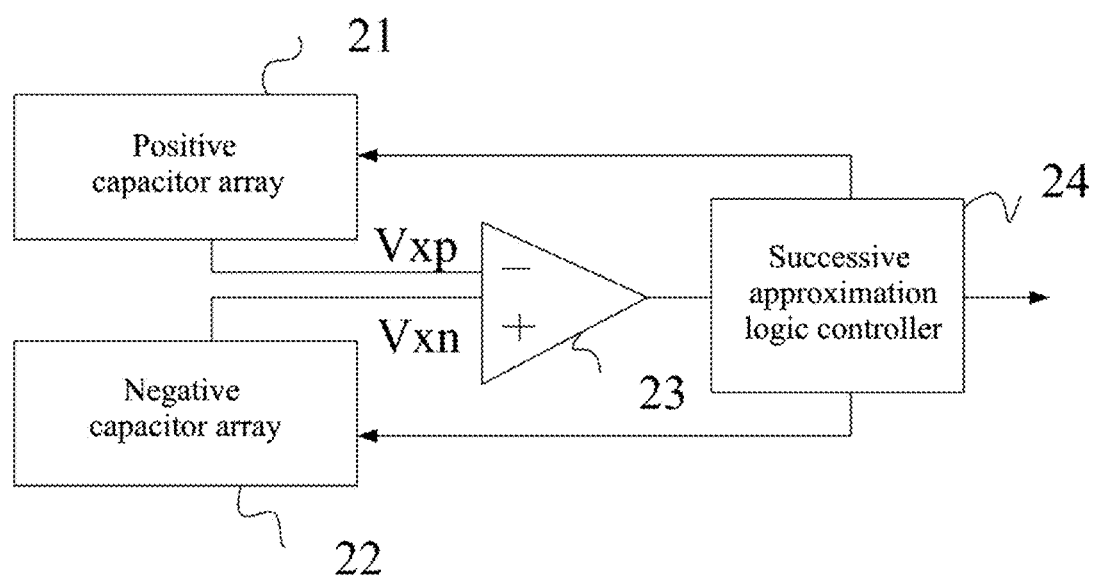
FIG. 2 is a schematic structural diagram of the exemplary capacitive analog-to-digital converter with an differential structure.

The capacitive analog-to-digital converter is a key component as an interface between an analog module and a digital module. Different capacitive analog-to-digital converters may be used in terms of different analog signals. For example, if an analog signal output by the analog module is a differential signal, a capacitive analog-to-digital converter with a differential structure is required. FIG. 2 is a schematic structural diagram of an exemplary capacitive analog-to-digital converter with a differential structure. As shown in FIG. 2, a positive capacitor array 21 and a negative capacitor array 22 are connected to two inputs of a comparator 23, respectively; an output of the comparator 23 is connected to a successive approximation logic controller 24; the successive approximation logic controller 24 controls an output voltage Vxp at the positive capacitor array 21 and an output voltage Vxn at the negative capacitor array 22 according to comparison results output by the comparator 23, until analog-to-digital conversion of a differential signal is completed; if an analog signal output by the analog module is a single-ended signal, a capacitive analog-to-digital converter with a single-ended structure is required, and reference may be made to the capacitive analog-to-digital converter shown in FIG. 1, for which details will not be described here again.

Based on the above application scenario, the technical solutions in the present application will be described hereunder in detail:

Embodiment 1

Figure 3:
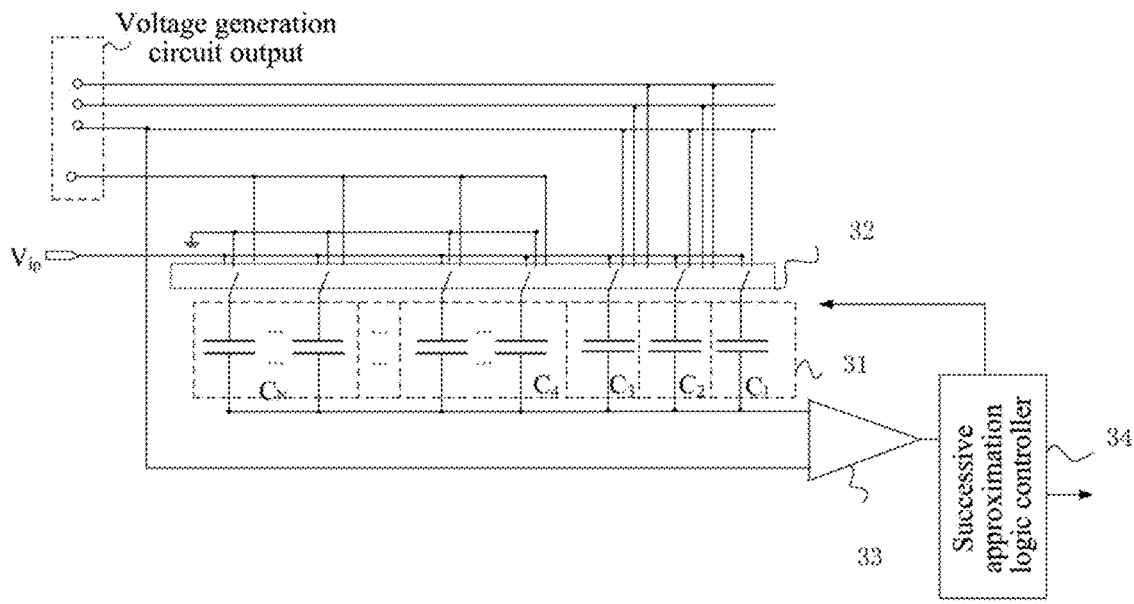
FIG. 3 is a schematic structural diagram of a capacitive analog-to-digital converter according to an embodiment of the present application.

FIG. 3 is a schematic structural diagram of a capacitive analog-to-digital converter according to an embodiment of the present application. As shown in FIG. 3, the capacitive analog-to-digital converter may include: a first capacitor array 31, M first switches 32, a comparator 33, and a successive approximation logic controller 34.

The first capacitor array 31 includes N first capacitor banks that include M first capacitors, where N is the number of bits of binary codes output by the capacitive analog-to-digital converter, N is a positive integer greater than or equal to 3, and M is a positive integer greater than N.

The first capacitor array 31 includes N first capacitor banks that include M first capacitors, where each first capacitor bank includes at least one first capacitor, and at least one first capacitor bank includes a plurality of first capacitors. The number of first capacitor banks and a specific first capacitor included in each first capacitor bank are not limited in the embodiments of the present application.

As shown in FIG. 3, the first capacitor array 31 includes a capacitor bank $C_1$, a capacitor bank $C_2$, a capacitor bank $C_3$, a capacitor bank $C_4$, . . . , and a capacitor bank CN. N first capacitor banks include M first capacitors. In an implementation, if a first capacitor bank has a capacitance which is an integer multiple of 4C, the first capacitor bank includes four capacitors with equal capacitance.

In an implementation, a $1^{st}$ one of the N first capacitor banks has a capacitance of C, and a $k^{th}$ one of the N first capacitor banks has a capacitance of $2^{k-2}C$, where C is capacitance per unit; a $p^{th}$ one of the N first capacitor banks includes one first capacitor, where p is an integer less than or equal to 3, and a $q^{th}$ one of the N first capacitor banks includes a plurality of first capacitors, where q is an integer greater than 3.

For ease of understanding, a four-bit capacitive analog-to-digital converter is used as an example, N=5, 5 first capacitor banks are included, a $1^{st}$ one of which has a capacitance of C, a $2^{nd}$ one of which has a capacitance of C, a $3^{rd}$ one of which has a capacitance of 2C, a $4^{th}$ one of which has a capacitance of 4C, and a $5^{th}$ one of which has a capacitance of 8C, where the $4^{th}$ capacitor bank and the $5^{th}$ capacitor bank each includes a plurality of capacitors, for each capacitor bank including the plurality of capacitors, an example is taken by having it include 4 capacitors, the $4^{th}$ capacitor bank includes 4 capacitors, each with a capacitance of C, and the $5^{th}$ capacitor bank includes 4 capacitors, each with a capacitance of 2C, therefore, the four-bit capacitive analog-to-digital converter includes 11 capacitors, and then the value of M is 11.

The M first switches 32 are respectively connected to first electrode plates of the M first capacitors in a one-to-one correspondence to enable the successive approximation logic controller 34 to control connections of the first electrode plates of the M first capacitors with an output of a voltage generation circuit and with a first sampling voltage output $V_{ip}$ by controlling the M first switches 32.

The M first switches 32 are respectively connected to first electrode plates of the M first capacitors in a one-to-one correspondence, where a $1^{st}$ first switch corresponds to a $1^{st}$ first capacitor, a $2^{nd}$ first switch corresponds to a $2^{nd}$ first capacitor, and so on, this is not limited in the embodiments of the present application. By controlling a connection of the first electrode plates of the M first capacitors with an output of a voltage generation circuit or with a first sampling voltage output $V_{ip}$, output voltage at second electrode plates of the M first capacitors may be controlled.

The comparator 33 includes a first input, a second input and an output, where second electrode plates of the M first capacitors are connected to the first input, and a first output of the voltage generation circuit is connected to the second input, and where the comparator 33 is configured to: compare a magnitude of voltage received at the first input with a magnitude of voltage received at the second input, and output N comparison results respectively corresponding to N bits of binary codes via the output of the comparator 33.

A magnitude of voltage output by the first output of the voltage generation circuit is not limited in the embodiments of the present application. The number of bits of binary codes output by the comparator is associated with the number of first capacitor banks, which is not limited in the embodiments of the present application. In addition, positive and negative electrodes for the first input and the second input of the comparator are not limited in the embodiments of the present application.

In an implementation, the comparator 33 is specifically configured to: output a comparison result of 1 under a circumstance that the magnitude of voltage received at the first input of the comparator 33 is greater than or equal to the magnitude of voltage received at the second input of the comparator 33; and output a comparison result of 0 under a circumstance that the magnitude of voltage received at the first input of the comparator 33 is less than the magnitude of voltage received at the second input of the comparator 33, and vice versa, which is not limited in the embodiments of the present application.

The successive approximation logic controller 34 is connected to the output of the comparator 33, and is configured to control the M first switches 32 according to the comparison results output by the output of the comparator 33.

The successive approximation logic controller is configured to control the M first switches 32 according to the comparison results output by the output of the comparator 33 in such a manner that the M first capacitors are maintained in a sampling stage or a conversion stage, which is not limited in the embodiments of the present application. In the sampling stage, it is configured to obtain a first sampling voltage analog signal output by the first sampling voltage output, and in the conversion stage, it is configured to convert the first sampling voltage analog signal into a digital signal which may be output by the successive approximation logic controller.

In this solution, a first capacitor array includes N capacitor banks connected to an input of a comparator, another terminal of the comparator is connected to a voltage generation circuit, an output of the comparator is connected to a successive approximation logic controller, and the successive approximation logic controller is configured to control, according to output results from the output of the comparator, a switch connected to each capacitor in such a manner that analog-to-digital conversion is achieved. Since the N first capacitor banks include M first capacitors and M is a positive integer greater than N, accuracy of the analog-to-digital conversion is improved by means of dividing high-level capacitors into capacitor banks and separately controlling capacitors in the capacitor banks.

Figure 4:
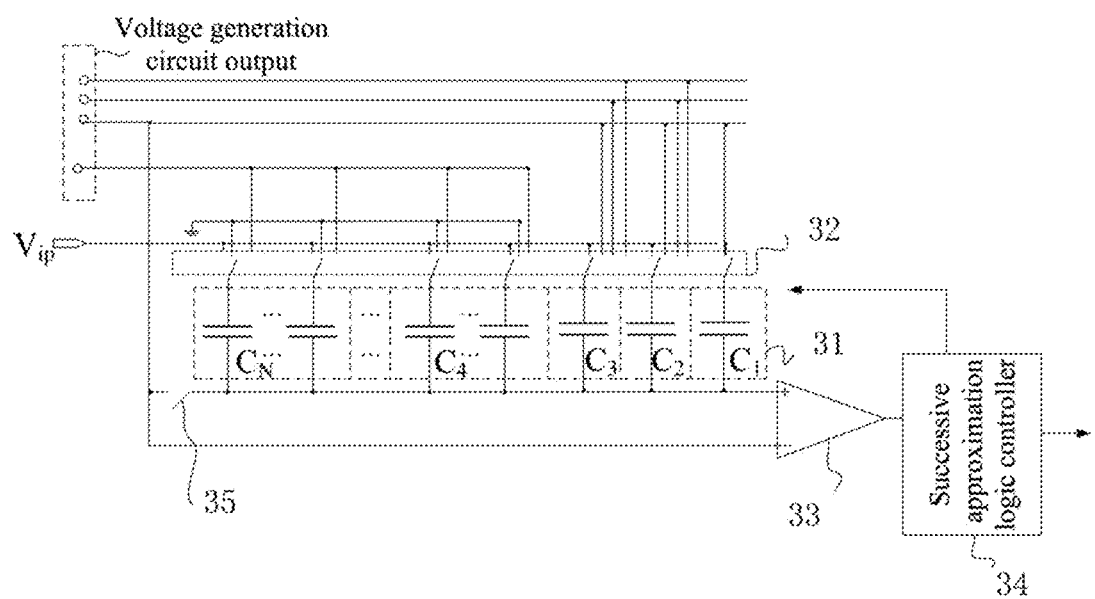
FIG. 4 is a schematic structural diagram of a capacitive analog-to-digital converter according to another embodiment of the present application.

In an implementation, FIG. 4 is a schematic structural diagram of a capacitive analog-to-digital converter according to another embodiment of the present application. As shown in FIG. 4, the capacitive analog-to-digital converter provided in the embodiment of the present application may further include:

a second switch 35, having its one end connected to the first input of the comparator 33 and its other end connected to the first output of the voltage generation circuit.

The second switch is provided to achieve disconnection and connection between the first input of the comparator and the first output of the voltage generation circuit, and in a sampling stage, the amount of sampling charge can be controlled by controlling the second switch.

In an implementation, the successive approximation logic controller 34 is configured to: in a sampling stage, control the M first switches 32 in such a manner that the first electrode plates of the M first capacitors are connected to the first sampling voltage output, and control the second switch

35 in such a manner that the first input of the comparator 33 is connected to the first output of the voltage generation circuit.

The M first switches 32 are controlled in such a manner that the electrode plates of the M first capacitors are connected to the first sampling voltage output, thereby achieving acquisition of a first sampling voltage analog signal, and the first input of the comparator 33 is connected to the first output of the voltage generation circuit, thereby achieving control over the amount of charge acquired. In a possible implementation, the first output of the voltage generation circuit outputs a voltage of VR/2, and VR is a reference voltage. A specific method for determining the reference voltage VR is not limited in the embodiments of the present application.

After the sampling stage, In an implementation, the successive approximation logic controller 34 is configured to: in a conversion stage, control the M first switches 32 and the second switch 35 to enable the M first capacitors to operate in an $n^{th}$ comparison mode, where n=1, ..., N; the comparator 33 is configured to: compare the magnitude of voltage received at the first input of the comparator 33 with the magnitude of voltage received at the second input of the comparator 33 under a circumstance that the M first capacitors are operating in the $n^{th}$ comparison mode, determine an $n^{th}$ comparison result among the N comparison results, and output the $n^{th}$ comparison result to the successive approximation logic controller 34, where the $n^{th}$ comparison result corresponds to an $N-n+1^{th}$ bit binary code among the N bits of binary codes.

In the conversion stage, the successive approximation logic controller is configured to control opening and closing of the M first switches and the second switch according to an output result at the output of the comparator, in such a manner that the M first capacitors operate in different comparison modes, thereby enabling the first capacitor array to output different magnitudes of voltage to the first input of the comparator, then by virtue of a comparison with the magnitude of voltage received at the second input of the comparator, comparison results are output to the successive approximation logic controller 34, so that the successive approximation logic controller readjusts the M first switches according to the comparison results output by the comparator, and then adjusts the magnitude of voltage output by the first capacitor array.

Figure 5:
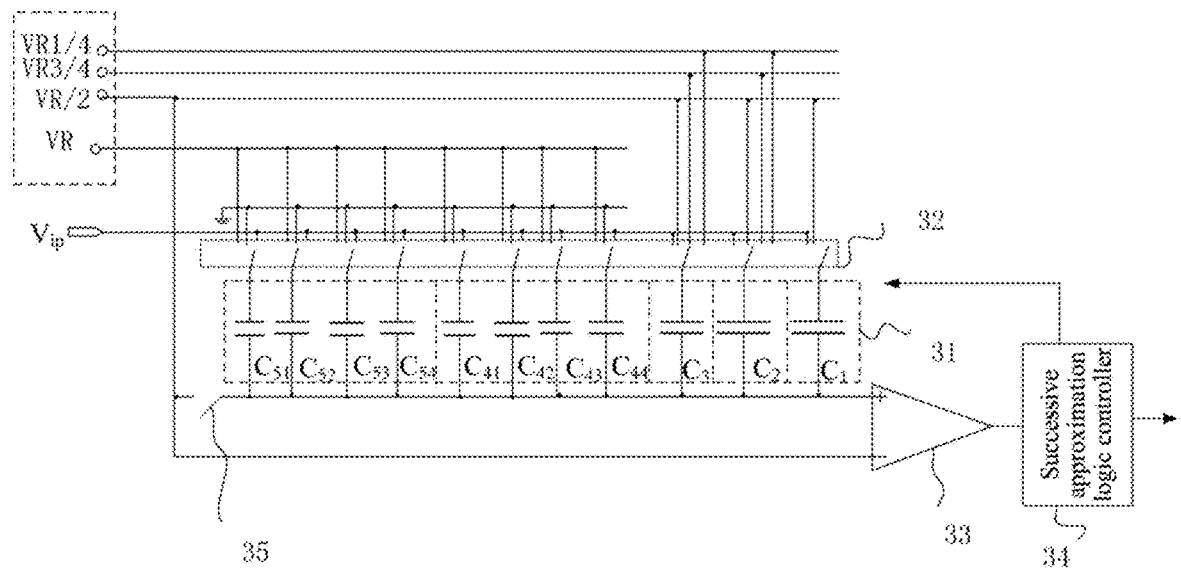
FIG. 5 is a schematic structural diagram of a capacitive analog-to-digital converter according to still another exemplary embodiment of the present application.

In a possible implementation, for ease of understanding, a four-bit capacitive analog-to-digital converter is used as an example to introduce an embodiment of the present application. FIG. 5 is a schematic structural diagram of a capacitive analog-to-digital converter according to still another exemplary embodiment of the present application. As shown in FIG. 5, in a sampling stage, the M first switches 32 are connected to the first sampling voltage output $V_{ip}$, and the first input of the comparator 33 is connected to the first output of the voltage generation circuit. Introduction is made by taking an example where the first output of the voltage generation circuit outputs a voltage of VR/2, the second output of the voltage generation circuit outputs a voltage of VR, and the first input of the comparator 33 inputs a voltage of Vx.

The successive approximation logic controller 34 is configured to: in the conversion stage, control the second switch to disconnect a connection of the first input of the comparator 33 with the first output of the voltage generation circuit.

In the conversion stage, the successive approximation logic controller firstly controls the second switch to disconnect a connection of the first input of the comparator with the first output of the voltage generation circuit, and then disconnects connections of the M first switches with the first sampling voltage output.

Then, the successive approximation logic controller is configured to control the M first switches in such a manner that a first capacitor in a first capacitor bank including a plurality of first capacitors is connected to a second reference voltage or connected to ground and in such a manner that a first capacitor in a first capacitor bank including one first capacitor is connected to a third reference voltage or connected to a fourth reference voltage, to enable the M first capacitors to operate in the $n^{th}$ comparison mode.

In an implementation, for each first capacitor bank including a plurality of first capacitors, the successive approximation logic controller is configured to control first switches corresponding to the plurality of first capacitors in the first capacitor bank in such a manner that first electrode plates of a first portion of first capacitors among the plurality of first capacitors are connected to the second output of the voltage generation circuit and first electrode plates of a second portion of first capacitors are connected to ground, to enable the M first capacitors to operate in a $1^{st}$ comparison mode.

The number of the first portion of first capacitors and the second portion of first capacitors is not limited in the embodiments of the present application. In an implementation, the first portion of first capacitors and the second portion of first capacitors are equal in number, and the first portion of first capacitors and the second portion of first capacitors form the first capacitor bank. In a possible implementation, the first capacitor bank includes 4 first capacitors, the first portion of first capacitors includes 2 first capacitors, and the second portion of first capacitors includes 2 first capacitors.

Compared with a situation where first electrode plates of all first capacitors in a first capacitor bank are connected to VR/2 and the charge stored in each first capacitor is the same, in the first capacitor bank that includes a plurality of first capacitors, first electrode plates of one half of the first capacitors are connected to VR while first electrode plates of the other half of the first capacitors are connected to ground, moreover, the first capacitor bank that includes the plurality of first capacitors is allowed to get power directly from VR and the ground terminal, so that emergence of VR/2 is avoided, therefore, a resistor string voltage divider structure is not required for supplying power to the first capacitor bank that includes the plurality of first capacitors, thereby reducing power consumption.

In addition, the output voltage at the second output of the voltage generation circuit is not limited in the embodiments of the present application. In an implementation, the second output of the voltage generation circuit has an output voltage of VR.

Taking FIG. 5 as an example, for a $5^{th}$ first capacitor bank and a $4^{th}$ first capacitor bank, the successive approximation logic controller 34 controls 4 first switches corresponding to the first capacitors in the $5^{th}$ first capacitor bank in such a manner that first electrode plates of any two of capacitors $C_{51}$, $C_{52}$, $C_{53}$, and $C_{54}$ in the $5^{th}$ first capacitor bank are connected to VR and first electrode plates of the other two capacitors are connected to ground. For example, the first electrode plates of the capacitors $C_{51}$ and $C_{52}$ are connected to VR, and the first electrode plates of the capacitors $C_{53}$ and $C_{54}$ are connected to ground. First electrode plates of any two of capacitors $C_{41}$, $C_{42}$, $C_{43}$, and $C_{44}$ in the $4^{th}$ first capacitor bank are connected to VR and first electrode plates of the other two capacitors are connected to ground. For example, the first electrode plates of the capacitors $C_{41}$ and $C_{42}$ are connected to VR, the first electrode plates of the capacitors $C_{43}$ and $C_{44}$ are connected to ground, and first switches corresponding to low-level capacitors $C_3$ and $C_2$ and a complementary capacitor $C_1$ are connected to the first output of the voltage generation circuit, to enable the M first capacitors to operate in a 1$^{st}$ comparison mode.

A voltage $V_X1$ received at the first input of the comparator 33 then can be calculated, and the formula is as follows:

$$(Vi-VR/2)*16C=(VR/2-Vx1)*16C$$

$$Vx1=VR-Vi$$

The comparator 33 compares magnitudes of $V_X1$ and VR/2, and outputs a comparison result. In a possible implementation, if $V_X1<VR/2$, the output is 0; and if $V_X1>VR/2$, the output is 1.

According to a 1$^{st}$ comparison result output by the comparator 33, for each first capacitor bank including a plurality of first capacitors, the successive approximation logic controller 34 controls a first switch in the first capacitor bank in such a manner that a first electrode plate of any first capacitor whose first electrode plate is connected to the second output of the voltage generation circuit is connected to ground or in such a manner that a first electrode plate of any first capacitor whose first electrode plate is connected to ground is connected to the second output of the voltage generation circuit, to enable the M first capacitors to operate in a 2$^{nd}$ comparison mode.

The successive approximation logic controller 34 receives comparison results output by the output of the comparator 33, and controls the M first switches 32 according to the comparison results. Illustratively, for the 5$^{th}$ capacitor bank and the 4$^{th}$ capacitor bank, any one of the capacitors $C_{53}$ and $C_{54}$ is connected to VR and any one of the capacitors $C_{43}$ and $C_{44}$ is connected to VR, for example, the capacitor $C_{53}$ and the capacitor $C_{43}$ are connected to VR, and for the other first switches, the connection mode remains unchanged. A magnitude of voltage Vx2 received at the first input of the comparator 33 can be then calculated as:

$$(VR/2-Vx1)*16C=(VR-Vx2)*6C+(0-Vx2)*2C+(VR-Vx2)*3C+(0-Vx2)*C+(VR/2-Vx2)*4C$$

$$Vx2=Vx1+3/16VR;$$

or, any one of the capacitors $C_{51}$ and $C_{52}$ is connected to ground and any one of the capacitors $C_{41}$ and $C_{42}$ is connected to ground, for example, the capacitor $C_{51}$ and the capacitor $C_{41}$ are connected to ground, and for the other first switches, the connection mode remains unchanged. Similarly, according to the principle of conservation of charge, a magnitude of voltage Vx2 received at the first input of the comparator 33 can be then calculated as:

$$Vx2=Vx1-3/16VR;$$

enabling the M first capacitors to operate in a 2$^{nd}$ comparison mode, magnitudes of Vx2 and VR/2 are compared. The comparator 33 compares magnitudes of $V_X2$ and VR/2, and outputs the 2$^{nd}$ comparison result. In a possible implementation, if $V_X2<VR/2$, the output is 0; and if $V_X2>VR/2$, the output is 1.

According to an m$^{th}$ comparison result output by the comparator 33, controlling a first switch for any first capacitor in an N−m+2$^{th}$ first capacitor bank whose first electrode plate is connected to ground in such a manner that the first electrode plate of the first capacitor is connected to the second output of the voltage generation circuit; or, controlling a first switch for any first capacitor in the N−m+2$^{th}$ first capacitor bank whose first electrode plate is connected to the second output of the voltage generation circuit in such a manner that the first electrode plate of the first capacitor is connected to ground, to enable the M first capacitors to operate in an m+1$^{th}$ comparison mode, where m=2, . . . , N−2.

Taking the capacitive analog-to-digital converter in FIG. 5 as an example, if the 2$^{nd}$ comparison result is output as 0, a first switch for a capacitor in the 5$^{th}$ capacitor bank whose first electrode plate is connected to ground is controlled in such a manner that the first electrode plate of the first capacitor is connected to VR, and for other switches, the connection mode remains unchanged. Similarly, according to the principle of conservation of charge, a magnitude of voltage Vx3 received at the first input of the comparator 33 can be then calculated as:

$$Vx3=Vx2+1/8VR;$$

if the 2$^{nd}$ comparison result is output as 1, a first switch for a capacitor in the 5th capacitor bank whose first electrode plate is connected to VR is controlled in such a manner that the first electrode plate of the first capacitor is connected to ground, and for other switches, the connection mode remains unchanged. Similarly, according to the principle of conservation of charge, a magnitude of voltage Vx3 received at the first input of the comparator 33 can be then calculated as:

$$Vx3=Vx2-1/8VR;$$

enabling the M first capacitors to operate in a 3$^{nd}$ comparison mode, magnitudes of Vx3 and VR/2 are compared.

The comparator 33 compares magnitudes of $V_X3$ and VR/2, and outputs the 3$^{rd}$ comparison result. In a possible implementation, if $V_X3<VR/2$, the output is 0; and if $V_X3>VR/2$, the output is 1.

Exemplarily, if the 3$^{rd}$ comparison result is output as 0, a first switch for a capacitor in the 4$^{th}$ capacitor bank whose first electrode plate is connected to ground is controlled in such a manner that the first electrode plate of the first capacitor is connected to VR, and for other switches, the connection mode remains unchanged. Similarly, according to the principle of conservation of charge, a magnitude of voltage Vx4 received at the first input of the comparator 33 can be then calculated as:

$$Vx4=Vx3+1/16VR;$$

if the 3$^{rd}$ comparison result is output as 1, a first switch for a capacitor in the 4$^{th}$ capacitor bank whose first electrode plate is connected to VR is controlled in such a manner that the first electrode plate of the first capacitor is connected to ground, and for other switches, the connection mode remains unchanged. Similarly, according to the principle of conservation of charge, a magnitude of voltage Vx4 received at the first input of the comparator 33 can be then calculated as:

$$Vx4=Vx3-1/16VR;$$

enabling the M first capacitors to operate in a 4$^{th}$ comparison mode, magnitudes of Vx4 and VR/2 are compared.

In a process of controlling first switches for a first capacitor bank that includes a plurality of first capacitors, simply a portion of capacitors will switch between VR and ground connections, thereby reducing power consumption required for switching.

The 4-bit capacitive analog-to-digital converter is only used as an example in the embodiments of the present application, and is not limited therein. For example, the embodiments of the present application may also use a 6-bit capacitive analog-to-digital converter, an 8-bit capacitive analog-to-digital converter, a 10-bit capacitive analog-to-digital converter, a 12-bit capacitive analog-to-digital converter, etc.

According to an N−1$^{th}$ comparison result output by the comparator 33, controlling a first switch for a first capacitor in a 3$^{rd}$ first capacitor bank in such a manner that a first electrode plate of the first capacitor is connected to a third output of the voltage generation circuit or a fourth output of the voltage generation circuit.

For a first capacitor bank including 1 first capacitor, according to a comparison result output by the comparator 33, a first switch for the first capacitor is controlled in such a manner that a first electrode plate of the first capacitor is connected to a third output or a fourth output of the voltage generation circuit, and magnitudes of voltage output at the third output and the fourth output of the voltage generation circuit are not limited in the embodiments of the present application.

Taking the capacitive analog-to-digital converter shown in FIG. 5 as an example, according to a 4$^{th}$ comparison result output by the comparator 33, controlling the first electrode plate of the capacitor C3 in such a manner that it is connected to the third output of the voltage generation circuit or the fourth output terminal of the voltage generation circuit. The comparator 33 compares magnitudes of $V_x4$ and VR/2, and outputs the 4$^{th}$ comparison result. In a possible implementation, if $V_x4$<VR/2, the output is 0; and if $V_x4$>VR/2, the output is 1.

If the 4$^{th}$ comparison result is output as 0, controlling the first electrode plate of the capacitor C3 to change from connection with VR/2 to connection with 3VR/4, at this point, a magnitude of voltage received at the first input of the comparator is Vx5=Vx4+1/32VR; if the 4$^{th}$ comparison result is output as 1, controlling the first electrode plate of the capacitor C3 to change from connection with VR/2 to connection with 1VR/4, at this point, a magnitude of voltage received at the first input of the comparator is Vx5=Vx4−1/32VR, enabling the M first capacitors to operate in a 5$^{th}$ comparison mode, and magnitudes of Vx5 and VR/2 are compared.

According to an N$^{th}$ comparison result output by the comparator 33, controlling a first switch for a first capacitor in a 2$^{nd}$ first capacitor bank in such a manner that a first electrode plate of the first capacitor is connected to the third output of the voltage generation circuit or the fourth output of the voltage generation circuit.

Taking the capacitive analog-to-digital converter shown in FIG. 5 as an example, according to a 5$^{th}$ comparison result output by the comparator 33, controlling the first electrode plate of the capacitor C2 in such a manner that it is connected to the third output of the voltage generation circuit or the fourth output terminal of the voltage generation circuit. The comparator 33 compares magnitudes of $V_x5$ and VR/2, and outputs the 5$^{th}$ comparison result. In a possible implementation, if $V_x5$<VR/2, the output is 0; and if $V_x5$>VR/2, the output is 1.

If the 5$^{th}$ comparison result is output as 0, controlling the first electrode plate of the capacitor C2 to change from connection with VR/2 to connection with 3VR/4, at this point, a magnitude of voltage received at the first input of the comparator is Vx6=Vx5+1/64VR; if the 5$^{th}$ comparison result is output as 1, controlling the first electrode plate of the capacitor C2 to change from connection with VR/2 to connection with 1VR/4, at this point, a magnitude of voltage received at the first input of the comparator is Vx6=Vx5−1/64VR.

According to the N comparison results output by the comparator, N bits of binary codes are obtained, and conversion of an analog signal into a digital signal is achieved. According to the digital signal and a weight of each bit of code in the digital signal, a magnitude of voltage for the analog signal may be obtained. The weight of each bit of code in the digital signal is not limited in the embodiments of the present application.

It can be seen from the above that, if results output by the output of the comparator 33 are all 1 and Vx6=1/2VR+1/64VR, a minimum first sampling voltage Vi that can be output may be obtained as:

$$(3/16+1/8+1/16+1/32+1/64+1/64+1/2)VR=VR-Vi$$

$$Vi\_min=1/16VR;$$

if results output by the output of the comparator 33 are all 0 and Vx6=1/2VR−1/64VR, a maximum first sampling voltage Vi that can be output may be obtained as:

$$-(3/16+1/8+1/16+1/32+1/64+1/64)VR+1/2VR=VR-Vi$$

$$Vi\_max=15/16VR;$$

therefore, the input range of the first sampling voltage Vi is [1/16VR, 15/16VR]. The minimum step is a difference between Vx6=Vx5+1/64VR and Vx6=Vx5−1/64VR when the 5$^{th}$ comparison result is 0 or 1, namely:

$$Vx5+1/64VR-(Vx5-1/64VR)=2/64VR$$

Calculate the accuracy of the capacitive analog-to-digital converter as:

$$(15/16-1/16)VR/(2/64)VR=28$$

$$\ln 2(28)=4.8 \text{ bits}$$

Compared with the 4-bit capacitive analog-to-digital converter in the related art, its accuracy is improved by 0.8 bit.

In this solution, states of the M first switches are controlled in different comparison modes, so that conversion of a sampling voltage analog signal into a digital signal is achieved, and accuracy of the analog-to-digital conversion is improved.

Figure 6:
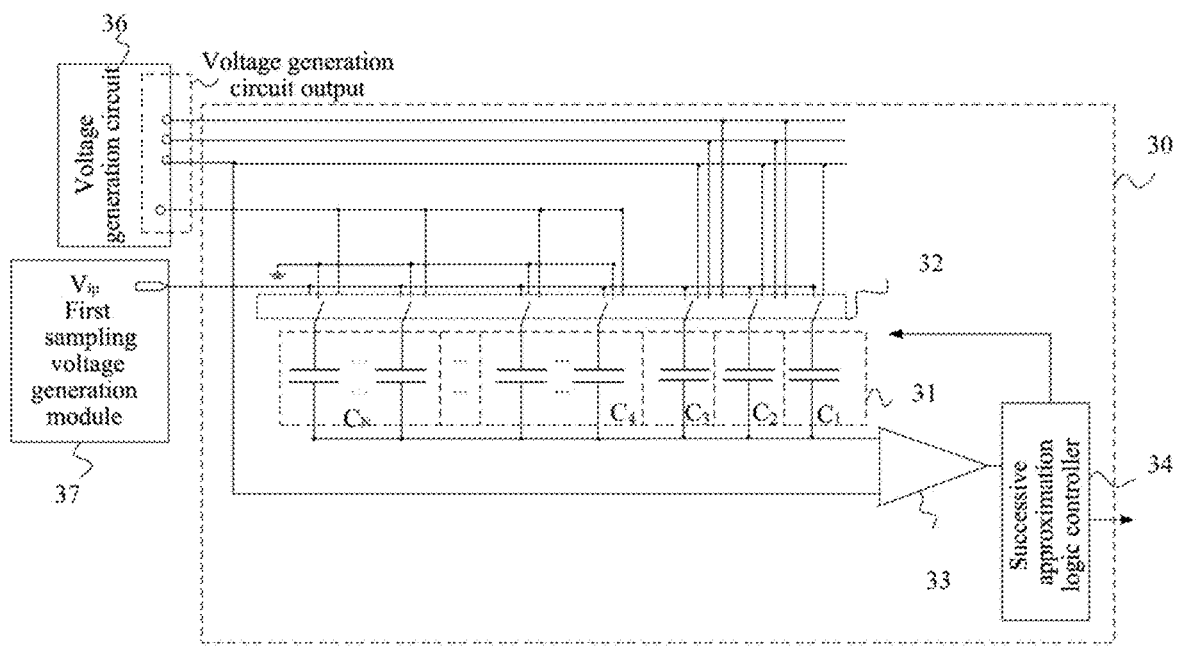
FIG. 6 is a schematic structural diagram of an analog-to-digital conversion system according to an embodiment of the present application.

An embodiment of the present application provides an analog-to-digital conversion system. FIG. 6 is a schematic structural diagram of an analog-to-digital conversion system according to an embodiment of the present application. As shown in FIG. 6, the analog-to-digital conversion system provided in the embodiment of the present application may include:

a voltage generation circuit 36, a first sampling voltage generation module 37, and the capacitive analog-to-digital converter 30 provided in the above embodiments; where the voltage generation circuit 36 includes a voltage generation circuit output which is configured to output a voltage; the first sampling voltage generation module 37 includes a first sampling voltage output $V_{ip}$ which is configured to output a first sampling voltage.

The capacitive analog-to-digital converter 30 includes:

a first capacitor array 31, including N first capacitor banks that include M first capacitors, where N is the number of bits of binary codes output by the capacitive analog-to-digital converter, N is a positive integer greater than or equal to 3, and M is a positive integer greater than N;

M first switches 32, respectively connected to first electrode plates of the M first capacitors in a one-to-one correspondence to enable a successive approximation logic controller to control connections of the first electrode plates of the M first capacitors with the output of the voltage generation circuit and with the first sampling voltage output by controlling the M first switches;

a comparator 33, which includes a first input, a second input and an output, where second electrode plates of the M first capacitors are connected to the first input, and a first output of the voltage generation circuit is connected to the second input, and where the comparator is configured to: compare a magnitude of voltage received at the first input with a magnitude of voltage received at the second input, and output N comparison results respectively corresponding to N bits of binary codes via the output of the comparator; and the successive approximation logic controller 34, connected to the output of the comparator, and configured to control the M first switches according to the comparison results output by the output of the comparator.

For its content and effects, reference may be made to the above embodiments, and details will not be described here again.

An embodiment of the present application provides a chip including the capacitive analog-to-digital converter provided in the above embodiments. For its content and effects, reference may be made to the above embodiments, and details will not be described here again.

An embodiment of the present application provide a terminal including the capacitive analog-to-digital converter provided in the above embodiments. For its content and effects, reference may be made to the above embodiments, and details will not be described here again.

The following is an introduction to a capacitive analog-to-digital converter according to the present application. The capacitive analog-to-digital converter is suitable for conversion of a differential signal into a digital signal, and part of its content is similar to that of the capacitive analog-to-digital converter in the above embodiments. For repetitive parts, details will not be described here again.

Figure 7:
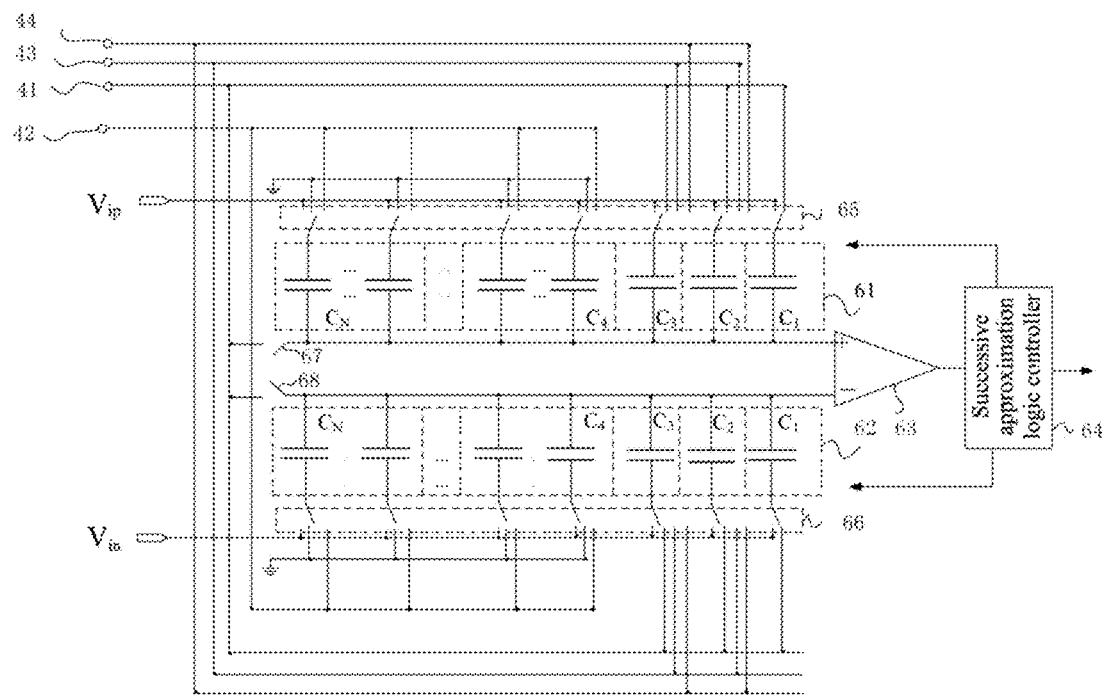
FIG. 7 is a schematic structural diagram of a capacitive analog-to-digital converter according to an embodiment of the present application.

FIG. 7 is a schematic structural diagram of a capacitive analog-to-digital converter according to an embodiment of the present application. As shown in FIG. 7, the capacitive analog-to-digital converter provided in the embodiment of the present application includes: a first capacitor array 61, a second capacitor array 62, M first switches 65, M third switches 66, a comparator 63, and a successive approximation logic controller 64.

The first capacitor array 61 includes N first capacitor banks that include M first capacitors, where N is the number of bits of binary codes output by the capacitive analog-to-digital converter, N is a positive integer greater than or equal to 3, and M is a positive integer greater than N.

The second capacitor array 62 includes N second capacitor banks that include M second capacitors.

The first capacitor array 61 and the second capacitor array 62 are same capacitor arrays. For the introduction, reference may be made to the description in the above embodiments, and details will not be described here again.

In an implementation, a $1^{st}$ one of the N first capacitor banks has a capacitance of C, and a $k^{th}$ one of the N first capacitor banks has a capacitance of $2^{k-2}C$, where C is capacitance per unit; a $p^{th}$ one of the N first capacitor banks includes one first capacitor, where p is an integer less than or equal to 3, and a $q^{th}$ one of the N first capacitor banks includes a plurality of first capacitors, where q is an integer greater than 3; a $1^{st}$ one of the N second capacitor banks has a capacitance of C, and a $k^{th}$ one of the N second capacitor banks has a capacitance of $2^{k-2}C$; and a $p^{th}$ one of the N second capacitor banks includes one second capacitor, and a $q^{th}$ one of the N second capacitor banks includes a plurality of second capacitors.

The M first switches 65 are respectively connected to first electrode plates of the M first capacitors in a one-to-one correspondence to enable a successive approximation logic controller 64 to control connections of the first electrode plates of the M first capacitors with an output of a voltage generation circuit and with a first sampling voltage output by controlling the M first switches 65.

The M third switches 66 are respectively connected to first electrode plates of the M second capacitors in a one-to-one correspondence to enable the successive approximation logic controller 64 to control connections of the first electrode plates of the M second capacitors with the output of the voltage generation circuit and with a second sampling voltage output by controlling the M third switches 66.

The comparator 63 includes a first input, a second input and an output, where second electrode plates of the M first capacitors are connected to the first input, and second electrode plates of the M second capacitors are connected to the second input, and where the comparator 63 is configured to: compare a magnitude of voltage received at the first input with a magnitude of voltage received at the second input, and output N comparison results respectively corresponding to N bits of binary codes via the output of the comparator 63.

In an implementation, the comparator 63 is specifically configured to: output a comparison result of 1 under a circumstance that the magnitude of voltage received at the first input of the comparator 63 is greater than or equal to the magnitude of voltage received at the second input of the comparator 63; and output a comparison result of 0 under a circumstance that the magnitude of voltage received at the first input of the comparator 63 is less than the magnitude of voltage received at the second input of the comparator 63, and vice versa, which is not limited in the embodiments of the present application.

In the embodiment of the present application, the first input of the comparator 63 is connected to second electrode plates of the M first capacitors, and the second input of the comparator 63 is connected to second electrode plates of the M second capacitors; a magnitude of voltage received at the first input is compared with a magnitude of voltage received at the second input, and comparison results are output to the successive approximation logic controller 64 by the output of the comparator 63, to enable the successive approximation logic controller 64 to control the M first switches 65 and the M third switches 66 according to the comparison results output by the output of the comparator 63.

The successive approximation logic controller 64 is connected to the output of the comparator 63, and configured to control the M first switches 65 and the M third switches 66 according to the comparison results output by the output of the comparator 63.

In this solution, the first capacitor array 61 and the second capacitor array 62 are provided, so that conversion of a differential signal into a digital signal is achieved, and accuracy of the conversion of the differential signal into the digital signal is improved.

In an implementation, as shown in FIG. 7, the capacitive analog-to-digital converter provided in the present application further includes:

a second switch 67, having its one end connected to the first input of the comparator 63 and its other end connected to the first output of the voltage generation circuit, where the first output of the voltage generation circuit outputs a first reference voltage; and a fourth switch 68, having its one end connected to the second input of the comparator 63 and its other end connected to the first output of the voltage generation circuit, where the first output of the voltage generation circuit outputs a first reference voltage.

The function of the fourth switch 68 is similar to that of the second switch 67. For details, reference may be made to the description of the second switch 67 in the above embodiments.

In an implementation, the successive approximation logic controller 64 is configured to: in a sampling stage, control the M first switches 65 in such a manner that the first electrode plates of the M first capacitors are connected to the first sampling voltage output $V_{ip}$, and control the second switch 67 in such a manner that the first input of the comparator 63 is connected to the first output of the voltage generation circuit; and control the M third switches 66 in such a manner that the first electrode plates of the M second capacitors are connected to the second sampling voltage output $V_{in}$, and control the fourth switch 68 in such a manner that the second input of the comparator 63 is connected to the first output of the voltage generation circuit.

The M first switches are controlled in such a manner that the electrode plates of the M first capacitors are connected to the first sampling voltage output, thereby achieving acquisition of a first sampling voltage analog signal, and the first input of the comparator is connected to the first output of the voltage generation circuit, thereby achieving control over the amount of charge acquired. The M third switches are controlled in such a manner that the electrode plates of the M second capacitors are connected to the second sampling voltage output, thereby achieving acquisition of a second sampling voltage analog signal, and the second input of the comparator is connected to the first output of the voltage generation circuit, thereby achieving control over the amount of charge acquired. In a possible implementation, the first output of the voltage generation circuit outputs a voltage of VR/2, and VR is a reference voltage. A specific method for determining the reference voltage VR is not limited in the embodiments of the present application.

In an implementation, the successive approximation logic controller 64 is configured to: in a conversion stage, control the M first switches 65, the second switch 67, the M third switches and the fourth switch 68 to enable the M first capacitors and the M second capacitors to operate in an $n^{th}$ comparison mode, where n=1, . . . , N.

The comparator 63 is configured to: compare the magnitude of voltage received at the first input of the comparator 63 with the magnitude of voltage received at the second input of the comparator 63 under a circumstance that the M first capacitors and the M second capacitors are operating in the $n^{th}$ comparison mode, determine an $n^{th}$ comparison result among the N comparison results, and output the $n^{th}$ comparison result to the successive approximation logic controller 64, where the $n^{th}$ comparison result corresponds to an $N-n+1^{th}$ bit binary code among the N bits of binary codes.

In an implementation, the successive approximation logic controller 64 is configured to: in the conversion stage, control the second switch 67 to disconnect a connection of the first input of the comparator 63 with the first output of the voltage generation circuit, and control the fourth switch 68 to disconnect a connection of the second input of the comparator 63 with the first output of the voltage generation circuit.

For each first capacitor bank including a plurality of first capacitors, the successive approximation logic controller 64 controls first switches corresponding to the plurality of first capacitors in the first capacitor bank in such a manner that first electrode plates of a first portion of first capacitors among the plurality of first capacitors are connected to a second output of the voltage generation circuit and first electrode plates of a second portion of first capacitors are connected to ground, for each second capacitor bank including a plurality of second capacitors, the successive approximation logic controller 64 controls third switches corresponding to the plurality of second capacitors in the second capacitor bank in such a manner that first electrode plates of a first portion of second capacitors among the plurality of second capacitors are connected to a second output of the voltage generation circuit and first electrode plates of a second portion of second capacitors are connected to ground, to enable the M first capacitors and the M second capacitors to operate in a $1^{st}$ comparison mode.

In the $1^{st}$ comparison mode, control methods of the first capacitor array 61 and the second capacitor array 62 are consistent. For details, reference may be made to the description related to the $1^{st}$ comparison mode in the above embodiments, which will not be described here again.

The number of the first portion of first capacitors and the second portion of first capacitors is not limited in the embodiments of the present application. In an implementation, the first portion of first capacitors and the second portion of first capacitors are equal in number, and the first portion of first capacitors and the second portion of first capacitors form the first capacitor bank. In a possible implementation, the first capacitor bank includes 4 first capacitors, the first portion of first capacitors includes 2 first capacitors, and the second portion of first capacitors includes 2 first capacitors.

Compared with a situation where first electrode plates of all first capacitors in a first capacitor bank and second capacitors are connected in a second capacitor bank to VR/2 and the charge stored in each first capacitor and second capacitor is the same, in the first capacitor bank that includes a plurality of first capacitors and the second capacitor bank that includes a plurality of second capacitors, first electrode plates of one half of the first capacitors and first electrode plates of one half of the second capacitors are connected to VR while first electrode plates of the other half of the first capacitors and first electrode plates of the other half of the second capacitors are connected to ground, moreover, the first capacitor bank that includes the plurality of first capacitors and the second capacitor bank that includes the plurality of second capacitors are allowed to get power directly from VR and the ground terminal, so that emergence of VR/2 is avoided, therefore, a resistor string voltage divider structure is not required for supplying power to the first capacitor bank and the second capacitor bank, thereby reducing power consumption.

In addition, the output voltage at the second output of the voltage generation circuit is not limited in the embodiments of the present application. In an implementation, the second output of the voltage generation circuit has an output voltage of VR.

According to a $1^{st}$ comparison result output by the comparator 63, for each first capacitor bank including a plurality of first capacitors, the successive approximation logic controller 64 controls a first switch for a first capacitor in the first capacitor bank in such a manner that a first electrode plate of any first capacitor whose first electrode plate is connected to the second output of the voltage generation circuit is connected to ground, for each second capacitor bank including a plurality of second capacitors, the successive approximation logic controller 64 controls a third switch for a second capacitor in the second capacitor bank in such a manner that a first electrode plate of any second capacitor whose first electrode plate is connected to ground is connected to the second output of the voltage generation circuit, or, according to a $1^{st}$ comparison result output by the comparator 63, for each first capacitor bank including a plurality of first capacitors, the successive approximation logic controller 64 controls a first switch in the first capacitor bank in such a manner that the first electrode plate of any first capacitor whose first electrode plate is connected to ground is connected to the second output of the voltage generation circuit, for each second capacitor bank including a plurality of second capacitors, the successive approximation logic controller 64 controls a third switch in the second capacitor bank in such a manner that a first electrode plate of any second capacitor whose first electrode plate is connected to the second output of the voltage generation circuit is connected to ground, to enable the M first capacitors and the M second capacitors to operate in a $2^{nd}$ comparison mode.

According to the $1^{st}$ comparison result, for the control over the first capacitor array 61, reference may be made to this part of description in the above embodiments, for the control over the second capacitor array 62, the control method is opposite to that of the first capacitor array 61, for example:

upon a comparison of a voltage $V_{XP}$ received at the first input of the comparator 63 with a voltage $V_{XN}$ received at the second input of the comparator 63, if $V_{XP}1<V_{XN}1$, the output of the comparator 63=0; if $V_{XP}1>V_{XN}1$, the output of the comparator 63 is 1.

If the output of the comparator 63 is 0, for each first capacitor bank including a plurality of first capacitors, the successive approximation logic controller 64 controls a first switch in the first capacitor bank in such a manner that a first electrode plate of any first capacitor whose first electrode plate is connected to ground is connected to the second output of the voltage generation circuit, for each second capacitor bank including a plurality of second capacitors, the successive approximation logic controller 64 controls a third switch in the second capacitor bank in such a manner that a first electrode plate of any second capacitor whose first electrode plate is connected to the second output of the voltage generation circuit is connected to ground.

If the output of the comparator 63 is 1, for each first capacitor bank including a plurality of first capacitors, the successive approximation logic controller 64 controls a first switch in the first capacitor bank in such a manner that a first electrode plate of any first capacitor whose first electrode plate is connected to the second output of the voltage generation circuit is connected to ground, for each second capacitor bank including a plurality of second capacitors, the successive approximation logic controller 64 controls a third switch in the second capacitor bank in such a manner that a first electrode plate of any second capacitor whose first electrode plate is connected to ground is connected to the second output of the voltage generation circuit.

According to an $m^{th}$ comparison result output by the comparator 63, controlling a first switch for any first capacitor in an N−m+$2^{th}$ first capacitor bank whose first electrode plate is connected to ground in such a manner that the first electrode plate of the first capacitor is connected to the second output of the voltage generation circuit, and controlling a third switch for any second capacitor in an N−m+$2^{th}$ second capacitor bank whose first electrode plate is connected to the second output of the voltage generation circuit in such a manner that the first electrode plate of the second capacitor is connected to ground; or, according to an $m^{th}$ comparison result output by the comparator 63, controlling a first switch for any first capacitor in the N−m+$2^{th}$ first capacitor bank whose first electrode plate is connected to the second output of the voltage generation circuit in such a manner that the first electrode plate of the first capacitor is connected to ground, and controlling a third switch for any second capacitor in the N−m+$2^{th}$ second capacitor bank whose first electrode plate is connected to ground in such a manner that the first electrode plate of the second capacitor is connected to the second output of the voltage generation circuit, to enable the M first capacitors and the M second capacitors to operate in an m+$1^{th}$ comparison mode, where m=2, . . . , N−2.

Similarly, for the $2^{nd}$ comparison result, if $V_{XP}2<V_{XN}2$, the output of the comparator 63=0; if $V_{XP}2>V_{XN}2$, the output of the comparator 63 is 1.

If the output of the comparator 63 is 0, controlling a first switch for any first capacitor in the N−m+$2^{th}$ first capacitor bank whose first electrode plate is connected to ground in such a manner that the first electrode plate of the first capacitor is connected to the second output of the voltage generation circuit, and controlling a third switch for any second capacitor in the N−m+$2^{th}$ second capacitor bank whose first electrode plate is connected to the second output of the voltage generation circuit in such a manner that the first electrode plate of the second capacitor is connected to ground.

If the output of the comparator 63 is 1, controlling a first switch for any first capacitor in the N−m+$2^{th}$ first capacitor bank whose first electrode plate is connected to the second output of the voltage generation circuit in such a manner that the first electrode plate of the first capacitor is connected to ground, and controlling a third switch for any second capacitor in the N−m+$2^{th}$ second capacitor bank whose first electrode plate is connected to ground in such a manner that the first electrode plate of the second capacitor is connected to the second output of the voltage generation circuit.

In an $m^{th}$ comparison mode, a sequential control from a highest-level capacitor bank to a lowest-level capacitor bank that includes a plurality of capacitors is performed, moreover, output voltages of the first capacitor array 61 and the second capacitor array 62 are adjusted respectively, for the sake of redundancy, details will not be described here.

According to an N−$1^{th}$ comparison result output by the comparator 63, controlling a first switch for a first capacitor in a $3^{rd}$ first capacitor bank in such a manner that a first electrode plate of the first capacitor is connected to the third output of the voltage generation circuit, and controlling a third switch for a second capacitor in a $3^{rd}$ second capacitor bank in such a manner that a first electrode plate of the second capacitor is connected to a fourth output of the voltage generation circuit; or, according to an N−$1^{th}$ comparison result output by the comparator 63, controlling the first switch for the first capacitor in the $3^{rd}$ first capacitor bank in such a manner that a first electrode plate of the first capacitor is connected to the fourth output of the voltage generation circuit, and controlling the third switch for the second capacitor in the $3^{rd}$ second capacitor bank in such a manner that the first electrode plate of the second capacitor is connected to the third output of the voltage generation circuit.

According to an $N^{th}$ comparison result output by the comparator 63, controlling a first switch for a first capacitor in a $2^{nd}$ first capacitor bank in such a manner that a first electrode plate of the first capacitor is connected to a third output of the voltage generation circuit, and controlling a third switch for a second capacitor in a $2^{nd}$ second capacitor bank in such a manner that a first electrode plate of the second capacitor is connected to a fourth output of the voltage generation circuit; or, according to an $N^{th}$ comparison result output by the comparator 63, controlling the first switch for the first capacitor in the $2^{nd}$ first capacitor bank first capacitor bank in such a manner that the first electrode plate of the first capacitor is connected to the fourth output of the voltage generation circuit, and controlling the third switch for the second capacitor in the $2^{nd}$ second capacitor bank in such a manner that a first electrode plate of the second capacitor is connected to the third output of the voltage generation circuit.

The second output of the voltage generation circuit outputs the second reference voltage, the third output of the voltage generation circuit outputs the third reference voltage, and the fourth output of the voltage generation circuit outputs the fourth reference voltage.

In an implementation, the first portion of first capacitors and the second portion of first capacitors are equal in number, and the first portion of first capacitors and the second portion of first capacitors form the first capacitor bank.

In an implementation, a $1^{st}$ one of the N first capacitor banks has a capacitance of C, and a $k^{th}$ one of the N first capacitor banks has a capacitance of $2^{k-2}C$, where C is capacitance per unit; a $p^{th}$ one of the N first capacitor banks includes one first capacitor, where p is an integer less than or equal to 3, and a $q^{th}$ one of the N first capacitor banks includes a plurality of first capacitors, where q is an integer greater than 3; a $1^{st}$ one of the N second capacitor banks has a capacitance of C, and a $k^{th}$ one of the N second capacitor banks has a capacitance of $2^{k-2}C$; and a $p^{th}$ one of the N second capacitor banks includes one second capacitor, and a $q^{th}$ one of the N second capacitor banks includes a plurality of second capacitors.

Figure 8:
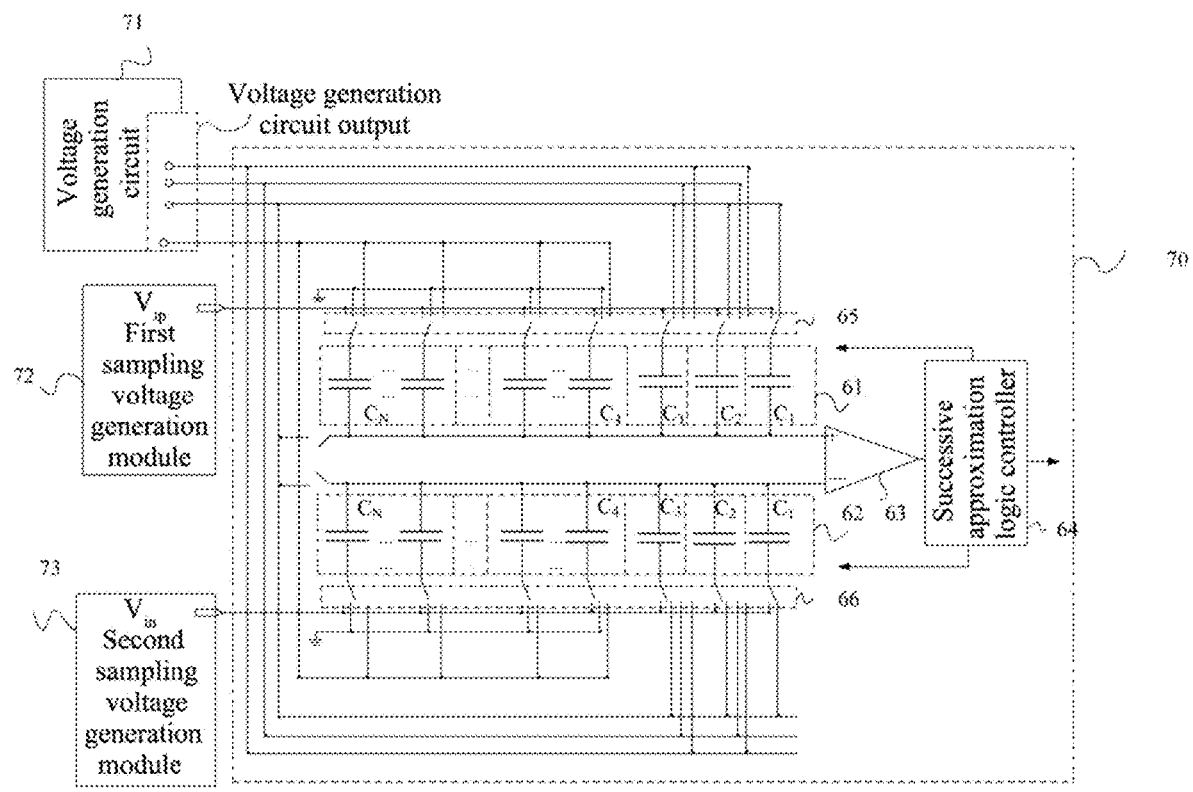
FIG. 8 is a schematic structural diagram of an analog-to-digital conversion system according to an embodiment of the present application.

An embodiment of the present application provides an analog-to-digital conversion system. FIG. 8 is a schematic structural diagram of an analog-to-digital conversion system according to an embodiment of the present application. As shown in FIG. 8, the analog-to-digital conversion system provided in the embodiment of the present application may include:

a voltage generation circuit 71, a first sampling voltage generation module 72, a second sampling voltage generation module 73, and the capacitive analog-to-digital converter 70 provided in the above embodiments.

The voltage generation circuit 71 includes a voltage generation circuit output which is configured to output a voltage.

The first sampling voltage generation module 72 includes a first sampling voltage output $V_{ip}$ which is configured to output a first sampling voltage.

The second sampling voltage generation module 73 includes a second sampling voltage output $V_{in}$ which is configured to output a second sampling voltage.

The capacitive analog-to-digital converter 70 includes:

a first capacitor array 61, including N first capacitor banks that include M first capacitors, where N is the number of bits of binary codes output by the capacitive analog-to-digital converter, N is a positive integer greater than or equal to 3, and M is a positive integer greater than N;

a second capacitor array 62, including N second capacitor banks that include M second capacitors;

M first switches 65, respectively connected to first electrode plates of the M first capacitors in a one-to-one correspondence to enable a successive approximation logic controller to control connections of the first electrode plates of the M first capacitors with the output of the voltage generation circuit and with the first sampling voltage output by controlling the M first switches;

M third switches 66, respectively connected to first electrode plates of the M second capacitors in a one-to-one correspondence to enable a successive approximation logic controller to control connections of the first electrode plates of the M second capacitors with the output of the voltage generation circuit and with the second sampling voltage output by controlling the M third switches;

a comparator 63, which includes a first input, a second input and an output, where second electrode plates of the M first capacitors are connected to the first input, second electrode plates of the M second capacitors are connected to the second input, and where the comparator is configured to: compare a magnitude of voltage received at the first input with a magnitude of voltage received at the second input, and output N comparison results respectively corresponding to N bits of binary codes via the output of the comparator; and the successive approximation logic controller 64, connected to the output of the comparator, and configured to control the M first switches and the M third switches according to the comparison results output by the output of the comparator.

For its content and effects, reference may be made to the above embodiments, and details will not be described here again.

An embodiment of the present application provides a chip including the capacitive analog-to-digital converter provided in the above embodiments. For its content and effects, reference may be made to the above embodiments, and details will not be described here again.

An embodiment of the present application provide a terminal including the capacitive analog-to-digital converter provided in the above embodiments. For its content and effects, reference may be made to the above embodiments, and details will not be described here again.

Finally, it should be noted that the foregoing embodiments are merely intended to describe the technical solutions in the present application other than limiting the present application. Although the present application has been described in detail with reference to the foregoing embodiments, persons of ordinary skill in the art should understand that they may still make modifications to the technical solutions recorded in the foregoing embodiments, or make equivalent replacements to some or all technical features thereof; however, these modifications or replacements do not make the essence of the corresponding technical solutions depart from the scope of the technical solutions in the embodiments of the present application.

What is claimed is:

1. A capacitive analog-to-digital converter, comprising:
a first capacitor array comprising N first capacitor banks that comprise M first capacitors, wherein N is the number of bits of binary codes output by the capacitive analog-to-digital converter, N is a positive integer greater than or equal to 3, and M is a positive integer greater than N;
M first switches respectively connected to first electrode plates of the M first capacitors in a one-to-one correspondence to enable a successive approximation logic controller to control connections of the first electrode plates of the M first capacitors with an output of a voltage generation circuit and with a first sampling voltage output by controlling the M first switches;
a comparator comprising a first input, a second input and an output, wherein second electrode plates of the M first capacitors are connected to the first input, and a first output of the voltage generation circuit is connected to the second input, and wherein the comparator is configured to:

compare a magnitude of voltage received at the first input with a magnitude of voltage received at the second input, and output N comparison results respectively corresponding to N bits of binary codes via the output of the comparator; and the successive approximation logic controller, connected to the output of the comparator, and configured to control the M first switches according to the comparison results output by the output of the comparator;

wherein a $1^{st}$ one of the N first capacitor banks has a capacitance of C, and a $k^{th}$ one of the N first capacitor banks has a capacitance of $2^{k-2}C$, wherein C is capacitance per unit; and a $p^{th}$ one of the N first capacitor banks comprises one first capacitor, wherein p is an integer less than or equal to 3, and a $q^{th}$ one of the N first capacitor banks comprises a plurality of first capacitors, wherein q is an integer greater than 3.

2. The capacitive analog-to-digital converter according to claim 1, further comprising:

a second switch having its one end connected to the first input of the comparator and its other end connected to the first output of the voltage generation circuit, wherein the first output of the voltage generation circuit outputs a first reference voltage.

3. The capacitive analog-to-digital converter according to claim 2, wherein the successive approximation logic controller is configured to:

in a sampling stage, control the M first switches in such a manner that the first electrode plates of the M first capacitors are connected to the first sampling voltage output, and control the second switch in such a manner that the first input of the comparator is connected to the first output of the voltage generation circuit.

4. The capacitive analog-to-digital converter according to claim 3, wherein, the successive approximation logic controller is configured to: in a conversion stage, control the M first switches and the second switch to enable the M first capacitors to operate in an $n^{th}$ comparison mode, wherein n=1, . . . , N; and the comparator is configured to: compare the magnitude of voltage received at the first input of the comparator with the magnitude of voltage received at the second input of the comparator under a circumstance that the M first capacitors are operating in the $n^{th}$ comparison mode, determine an $n^{th}$ comparison result among the N comparison results, and output the $n^{th}$ comparison result to the successive approximation logic controller, wherein the $n^{th}$ comparison result corresponds to an $N-n+1^{th}$ bit binary code among the N bits of binary codes.

5. The capacitive analog-to-digital converter according to claim 4, wherein the successive approximation logic controller is configured to:

in the conversion stage, control the second switch to disconnect a connection of the first input of the comparator with the first output of the voltage generation circuit; and control the M first switches in such a manner that a first capacitor in a first capacitor bank comprising a plurality of first capacitors is connected to a second reference voltage or connected to ground and in such a manner that a first capacitor in a first capacitor bank comprising one first capacitor is connected to a third reference voltage or connected to a fourth reference voltage, to enable the M first capacitors to operate in the $n^{th}$ comparison mode.

6. The capacitive analog-to-digital converter according to claim 5, wherein for each first capacitor bank comprising a plurality of first capacitors, the successive approximation logic controller is configured to control first switches corresponding to the plurality of first capacitors in the first capacitor bank in such a manner that first electrode plates of a first portion of first capacitors among the plurality of first capacitors are connected to a second output of the voltage generation circuit and first electrode plates of a second portion of first capacitors are connected to ground, to enable the M first capacitors to operate in a $1^{st}$ comparison mode;

according to a $1^{st}$ comparison result output by the comparator, for each first capacitor bank comprising a plurality of first capacitors, the successive approximation logic controller is configured to control a first switch for a first capacitor in the first capacitor bank in such a manner that a first electrode plate of any first capacitor whose first electrode plate is connected to the second output of the voltage generation circuit is connected to ground or in such a manner that a first electrode plate of any first capacitor whose first electrode plate is connected to ground is connected to the second output of the voltage generation circuit, to enable the M first capacitors to operate in a $2^{nd}$ comparison mode;

according to an $m^{th}$ comparison result output by the comparator, the successive approximation logic controller is configured to control a first switch for any first capacitor in an $N-m+2^{th}$ first capacitor bank whose first electrode plate is connected to ground in such a manner that the first electrode plate of the first capacitor is connected to the second output of the voltage generation circuit; or, the successive approximation logic controller is configured to control a first switch for any first capacitor in the $N-m+2^{th}$ first capacitor bank whose first electrode plate is connected to the second output of the voltage generation circuit in such a manner that the first electrode plate of the first capacitor is connected to ground, to enable the M first capacitors to operate in an $m+1^{th}$ comparison mode, wherein m=2, . . . , N−2;

according to an $N-1^{th}$ comparison result output by the comparator, the successive approximation logic controller is configured to control a first switch for a first capacitor in a $3^{rd}$ first capacitor bank in such a manner that a first electrode plate of the first capacitor is connected to a third output of the voltage generation circuit or a fourth output of the voltage generation circuit; and according to an $N^{th}$ comparison result output by the comparator, the successive approximation logic controller is configured to control a first switch for a first capacitor in a $2^{nd}$ first capacitor bank in such a manner that a first electrode plate of the first capacitor is connected to the third output of the voltage generation circuit or the fourth output of the voltage generation circuit;

wherein the second output of the voltage generation circuit outputs the second reference voltage, the third output of the voltage generation circuit outputs the third reference voltage, and the fourth output of the voltage generation circuit outputs the fourth reference voltage.

7. The capacitive analog-to-digital converter according to claim 6, wherein,
the first portion of first capacitors and the second portion of first capacitors are equal in number, and the first portion of first capacitors and the second portion of first capacitors form the first capacitor bank.

8. The capacitive analog-to-digital converter according to claim 1, wherein the comparator is configured to:
output a comparison result of 1 under a circumstance that the magnitude of voltage received at the first input of the comparator is greater than or equal to the magnitude of voltage received at the second input of the comparator; and output a comparison result of 0 under a circumstance that the magnitude of voltage received at the first input of the comparator is less than the magnitude of voltage received at the second input of the comparator.

9. The capacitive analog-to-digital converter according to claim 1, comprising:
a first capacitor bank has a capacitance which is an integer multiple of 4C, and the first capacitor bank comprises four capacitors with equal capacitance.

10. A capacitive analog-to-digital converter, comprising:
a first capacitor array comprising N first capacitor banks that comprise M first capacitors, wherein N is the number of bits of binary codes output by the capacitive analog-to-digital converter, N is a positive integer greater than or equal to 3, and M is a positive integer greater than N;
a second capacitor array comprising N second capacitor banks that comprise M second capacitors;
M first switches respectively connected to first electrode plates of the M first capacitors in a one-to-one correspondence to enable a successive approximation logic controller to control connections of the first electrode plates of the M first capacitors with an output of a voltage generation circuit and with a first sampling voltage output by controlling the M first switches;
M third switches respectively connected to first electrode plates of the M second capacitors in a one-to-one correspondence to enable the successive approximation logic controller to control connections of the first electrode plates of the M second capacitors with the output of the voltage generation circuit and with a second sampling voltage output by controlling the M third switches;
a comparator comprising a first input, a second input and an output, wherein second electrode plates of the M first capacitors are connected to the first input, and second electrode plates of the M second capacitors are connected to the second input, and wherein the comparator is configured to: compare a magnitude of voltage received at the first input with a magnitude of voltage received at the second input, and output N comparison results respectively corresponding to N bits of binary codes via the output of the comparator; and
the successive approximation logic controller is connected to the output of the comparator, and configured to control the M first switches and the M third switches according to the comparison results output by the output of the comparator;
wherein a $1^{st}$ one of the N first capacitor banks has a capacitance of C, and a $k^{th}$ one of the N first capacitor banks has a capacitance of $2^{k-2}C$, wherein C is capacitance per unit;
a $p^{th}$ one of the N first capacitor banks comprises one first capacitor, wherein p is an integer less than or equal to 3, and a $q^{th}$ one of the N first capacitor banks comprises a plurality of first capacitors, wherein q is an integer greater than 3.

11. The capacitive analog-to-digital converter according to claim 10, further comprising:
a second switch having its one end connected to the first input of the comparator and its other end connected to the first output of the voltage generation circuit, wherein the first output of the voltage generation circuit outputs a first reference voltage; and
a fourth switch having its one end connected to the second input of the comparator and its other end connected to the first output of the voltage generation circuit, wherein the first output of the voltage generation circuit outputs a first reference voltage.

12. The capacitive analog-to-digital converter according to claim 11, wherein the successive approximation logic controller is configured to:
in a sampling stage, control the M first switches in such a manner that the first electrode plates of the M first capacitors are connected to the first sampling voltage output, and control the second switch in such a manner that the first input of the comparator is connected to the first output of the voltage generation circuit; and
control the M third switches in such a manner that the first electrode plates of the M second capacitors are connected to the second sampling voltage output, and control the fourth switch in such a manner that the second input of the comparator is connected to the first output of the voltage generation circuit.

13. The capacitive analog-to-digital converter according to claim 12, wherein,
the successive approximation logic controller is configured to: in a conversion stage, control the M first switches, the second switch, the M third switches and the fourth switch to enable the M first capacitors and the M second capacitors to operate in an $n^{th}$ comparison mode, wherein n=1, . . . , N;
the comparator is configured to: compare the magnitude of voltage received at the first input of the comparator with the magnitude of voltage received at the second input of the comparator under a circumstance that the M first capacitors and the M second capacitors are operating in the $n^{th}$ comparison mode, determine an $n^{th}$ comparison result among the N comparison results, and output the $n^{th}$ comparison result to the successive approximation logic controller, wherein the $n^{th}$ comparison result corresponds to an $N-n+1^{th}$ bit binary code among the N bits of binary codes.

14. The capacitive analog-to-digital converter according to claim 13, wherein the successive approximation logic controller is configured to:
in the conversion stage, control the second switch to disconnect a connection of the first input of the comparator with the first output of the voltage generation circuit, and control the fourth switch to disconnect a connection of the second input of the comparator with the first output of the voltage generation circuit; and
control the M first switches in such a manner that a first capacitor in a first capacitor bank comprising a plurality of first capacitors is connected to a second reference voltage or connected to ground and in such a manner that a first capacitor in a first capacitor bank comprising one first capacitor is connected to a third reference voltage or connected to a fourth reference voltage, and control the M third switches in such a manner that a second capacitor in a second capacitor bank comprising a plurality of second capacitors is connected to the second reference voltage or connected to ground and in such a manner that a second capacitor in a second capacitor bank comprising one second capacitor is connected to the third reference voltage or connected to the fourth reference voltage, to enable the M first capacitors and the M second capacitors to operate in the $n^{th}$ comparison mode.

15. The capacitive analog-to-digital converter according to claim 14, wherein, for each first capacitor bank comprising a plurality of first capacitors, the successive approximation logic controller is configured to control first switches for the plurality of first capacitors in the first capacitor bank in such a manner that first electrode plates of a first portion of first capacitors among the plurality of first capacitors are connected to a second output of the voltage generation circuit and first electrode plates of a second portion of first capacitors are connected to ground, for each second capacitor bank comprising a plurality of second capacitors, the successive approximation logic controller is configured to control third switches for the plurality of second capacitors in the second capacitor bank in such a manner that first electrode plates of a first portion of second capacitors among the plurality of second capacitors are connected to a second output of the voltage generation circuit and first electrode plates of a second portion of second capacitors are connected to ground, to enable the M first capacitors and the M second capacitors to operate in a $1^{st}$ comparison mode;

according to a $1^{st}$ comparison result output by the comparator, for each first capacitor bank comprising a plurality of first capacitors, the successive approximation logic controller is configured to control a first switch for a first capacitor in the first capacitor bank in such a manner that a first electrode plate of any first capacitor whose first electrode plate is connected to the second output of the voltage generation circuit is connected to ground, for each second capacitor bank comprising a plurality of second capacitors, the successive approximation logic controller is configured to control a third switch for a second capacitor in the second capacitor bank in such a manner that a first electrode plate of any second capacitor whose first electrode plate is connected to ground is connected to the second output of the voltage generation circuit, or, according to a $1^{st}$ comparison result output by the comparator, for each first capacitor bank comprising a plurality of first capacitors, the successive approximation logic controller is configured to control a first switch for a first capacitor in the first capacitor bank in such a manner that a first electrode plate of any first capacitor whose first electrode plate is connected to ground is connected to the second output of the voltage generation circuit, for each second capacitor bank comprising a plurality of second capacitors, the successive approximation logic controller is configured to control a third switch for a second capacitor in the second capacitor bank in such a manner that a first electrode plate of any second capacitor whose first electrode plate is connected to the second output of the voltage generation circuit is connected to ground, to enable the M first capacitors and the M second capacitors to operate in a $2^{nd}$ comparison mode;

according to an $m^{th}$ comparison result output by the comparator, the successive approximation logic controller is configured to control a first switch for any first capacitor in an $N-m+2^{th}$ first capacitor bank whose first electrode plate is connected to ground in such a manner that the first electrode plate of the first capacitor is connected to the second output of the voltage generation circuit, and control a third switch for any second capacitor in an $N-m+2^{th}$ second capacitor bank whose first electrode plate is connected to the second output of the voltage generation circuit in such a manner that the first electrode plate of the second capacitor is connected to ground; or, according to an $m^{th}$ comparison result output by the comparator, the successive approximation logic controller is configured to control a first switch for any first capacitor in the $N-m+2^{th}$ first capacitor bank whose first electrode plate is connected to the second output of the voltage generation circuit in such a manner that the first electrode plate of the first capacitor is connected to ground, and control a third switch for any second capacitor in the $N-m+2^{th}$ second capacitor bank whose first electrode plate is connected to ground in such a manner that the first electrode plate of the second capacitor is connected to the second output of the voltage generation circuit, to enable the M first capacitors and the M second capacitors to operate in an $m+1^{th}$ comparison mode, wherein m=2, . . . , N−2;

according to an $N-1^{th}$ comparison result output by the comparator, the successive approximation logic controller is configured to control a first switch for a first capacitor in a $3^{rd}$ first capacitor bank in such a manner that a first electrode plate of the first capacitor is connected to a third output of the voltage generation circuit, and control a third switch for a second capacitor in a $3^{rd}$ second capacitor bank in such a manner that a first electrode plate of the second capacitor is connected to a fourth output of the voltage generation circuit; or, according to an $N-1^{th}$ comparison result output by the comparator, the successive approximation logic controller is configured to control the first switch for the first capacitor in the $3^{rd}$ first capacitor bank in such a manner that the first electrode plate of the first capacitor is connected to the fourth output of the voltage generation circuit, and control the third switch for the second capacitor in the $3^{rd}$ second capacitor bank in such a manner that the first electrode plate of the second capacitor is connected to the third output of the voltage generation circuit;

according to an $N^{th}$ comparison result output by the comparator, the successive approximation logic controller is configured to control a first switch for a first capacitor in a $2^{nd}$ first capacitor bank in such a manner that a first electrode plate of the first capacitor is connected to the third output of the voltage generation circuit, and control a third switch for a second capacitor in a $2^{nd}$ second capacitor bank in such a manner that a first electrode plate of the second capacitor is connected to the fourth output of the voltage generation circuit; or, according to an $N^{th}$ comparison result output by the comparator, the successive approximation logic controller is configured to control the first switch for the first capacitor in the $2^{nd}$ first capacitor bank in such a manner that the first electrode plate of the first capacitor is connected to the fourth output of the voltage generation circuit, and control the third switch for the second capacitor in the $2^{nd}$ second capacitor bank in such a manner that the first electrode plate of the second capacitor is connected to the third output of the voltage generation circuit;

wherein the second output of the voltage generation circuit outputs the second reference voltage, the third output of the voltage generation circuit outputs the third reference voltage, and the fourth output of the voltage generation circuit outputs the fourth reference voltage; and the first portion of first capacitors and the second portion of first capacitors are equal in number, and the first portion of first capacitors and the second portion of first capacitors form the first capacitor bank; and the first portion of second capacitors and the second portion of second capacitors are equal in number, and the first portion of second capacitors and the second portion of second capacitors form the second capacitor bank.

16. The capacitive analog-to-digital converter according to claim 10, comprising:

a $1^{st}$ one of the N second capacitor banks has a capacitance of C, and a $k^{th}$ one of the N second capacitor banks has a capacitance of $2^{k-2}C$; and a $p^{th}$ one of the N second capacitor banks comprises one second capacitor, and a $q^{th}$ one of the N second capacitor banks comprises a plurality of second capacitors.

17. The capacitive analog-to-digital converter according to claim 10, wherein the comparator is configured to:

output a comparison result of 1 under a circumstance that the magnitude of voltage received at the first input of the comparator is greater than or equal to the magnitude of voltage received at the second input of the comparator; and output a comparison result of 0 under a circumstance that the magnitude of voltage received at the first input of the comparator is less than the magnitude of voltage received at the second input of the comparator.

18. The capacitive analog-to-digital converter according to claim 10, comprising:

a first capacitor bank has a capacitance which is an integer multiple of 4C, and the first capacitor bank comprises four capacitors with equal capacitance; and a second capacitor bank has a capacitance which is an integer multiple of 4C, and the second capacitor bank comprises four capacitors with equal capacitance.

19. A chip, comprising a capacitive analog-to-digital converter, the capacitive analog-to-digital converter comprising:

a first capacitor array, comprising N first capacitor banks that comprise M first capacitors, wherein N is the number of bits of binary codes output by the capacitive analog-to-digital converter, N is a positive integer greater than or equal to 3, and M is a positive integer greater than N;

M first switches, respectively connected to first electrode plates of the M first capacitors in a one-to-one correspondence to enable a successive approximation logic controller to control connections of the first electrode plates of the M first capacitors with an output of a voltage generation circuit and with a first sampling voltage output by controlling the M first switches;

a comparator, comprising a first input, a second input and an output, wherein second electrode plates of the M first capacitors are connected to the first input, and a first output of the voltage generation circuit is connected to the second input, and wherein the comparator is configured to: compare a magnitude of voltage received at the first input with a magnitude of voltage received at the second input, and output N comparison results respectively corresponding to N bits of binary codes via the output of the comparator; and the successive approximation logic controller, connected to the output of the comparator, and configured to control the M first switches according to the comparison results output by the output of the comparator;

wherein a $1^{st}$ one of the N first capacitor banks has a capacitance of C, and a $k^{th}$ one of the N first capacitor banks has a capacitance of $2^{k-2}C$, wherein C is capacitance per unit; and a $p^{th}$ one of the N first capacitor banks comprises one first capacitor, wherein p is an integer less than or equal to 3, and a $q^{th}$ one of the N first capacitor banks comprises a plurality of first capacitors, wherein q is an integer greater than 3.

* * * * *